(12) United States Patent
Yamazaki et al.

(10) Patent No.: US 9,429,800 B2
(45) Date of Patent: *Aug. 30, 2016

(54) SEMICONDUCTOR DEVICE

(71) Applicant: Semiconductor Energy Laboratory Co., Ltd., Atsugi-shi, Kanagawa-ken (JP)

(72) Inventors: Shunpei Yamazaki, Tokyo (JP); Toru Takayama, Kanagawa (JP); Junya Maruyama, Kanagawa (JP); Yuugo Goto, Kanagawa (JP); Yumiko Ohno, Kanagawa (JP); Yasuyuki Arai, Kanagawa (JP); Noriko Shibata, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/775,526

(22) Filed: Feb. 25, 2013

(65) Prior Publication Data

US 2013/0161623 A1    Jun. 27, 2013

Related U.S. Application Data

(63) Continuation of application No. 13/276,350, filed on Oct. 19, 2011, now Pat. No. 8,384,699, which is a continuation of application No. 12/823,182, filed on Jun. 25, 2010, now Pat. No. 8,044,946, which is a continuation of application No. 11/619,035, filed on Jan. 2, 2007, now Pat. No. 7,746,333, which is a continuation of application No. 10/774,700, filed on Feb. 10, 2004, now Pat. No. 7,164,151.

(30) Foreign Application Priority Data

Feb. 12, 2003 (JP) ................................ 2003-033194

(51) Int. Cl.
*H01L 27/15* (2006.01)
*G02F 1/1345* (2006.01)
*H01L 21/20* (2006.01)
*H01L 21/683* (2006.01)
*H01L 21/762* (2006.01)
*H01L 27/12* (2006.01)

(52) U.S. Cl.
CPC ....... *G02F 1/13452* (2013.01); *H01L 21/2007* (2013.01); *H01L 21/6835* (2013.01);
(Continued)

(58) Field of Classification Search
USPC .......................... 345/204; 257/434; 349/149
See application file for complete search history.

(56) References Cited

U.S. PATENT DOCUMENTS 5,060,027 A * 10/1991 Hart et al. ...................... 257/88
5,084,961 A *  2/1992 Yoshikawa ..................... 29/840

(Continued)

FOREIGN PATENT DOCUMENTS

EP    0858110 A1    8/1998
EP    0986104 A1    3/2000

(Continued)

OTHER PUBLICATIONS

Exhibition of Active Matrix Type Organic EL Display at "13th Flat Panel Display Manufacturing Technology Expo & Conference" by ELDis Group (in Japanese with full translation); Jul. 2, 2003.

(Continued)

*Primary Examiner* — Kumar Patel
*Assistant Examiner* — Afroza Chowdhury
(74) *Attorney, Agent, or Firm* — Fish & Richardson P.C.

(57) ABSTRACT

The present invention intends to realize a narrow flame of a system on panel. In addition to this, a system mounted on a panel is intended to make higher and more versatile in the functionality. In the invention, on a panel on which a pixel portion (including a liquid crystal element, a light-emitting element) and a driving circuit are formed, integrated circuits that have so far constituted an external circuit are laminated and formed. Specifically, of the pixel portion and the driving circuit on the panel, on a position that overlaps with the driving circuit, any one kind or a plurality of kinds of the integrated circuits is formed by laminating according to a transcription technique.

20 Claims, 15 Drawing Sheets

(52) U.S. Cl.
CPC ..... *H01L21/76251* (2013.01); *H01L 27/1214* (2013.01); *H01L 27/1266* (2013.01); *H01L 27/15* (2013.01); *G02F 1/13454* (2013.01); *G02F 2001/13456* (2013.01); *H01L 2221/68368* (2013.01); *H01L 2224/16* (2013.01); *H01L 2924/01004* (2013.01); *H01L 2924/01025* (2013.01); *H01L 2924/01046* (2013.01); *H01L 2924/01055* (2013.01); *H01L 2924/01077* (2013.01); *H01L 2924/01078* (2013.01); *H01L 2924/01079* (2013.01); *H01L 2924/04941* (2013.01); *H01L 2924/12044* (2013.01); *H01L 2924/3025* (2013.01)

(56) References Cited

U.S. PATENT DOCUMENTS

| | | |
|---|---|---|
| 5,206,749 A | 4/1993 | Zavracky et al. |
| 5,317,236 A | 5/1994 | Zavracky et al. |
| 5,376,561 A | 12/1994 | Vu et al. |
| 5,612,549 A * | 3/1997 | Nelson et al. ............ 257/88 |
| 5,703,394 A * | 12/1997 | Wei et al. ............ 257/433 |
| 5,804,872 A | 9/1998 | Miyano et al. |
| 5,821,138 A | 10/1998 | Yamazaki et al. |
| 5,834,327 A | 11/1998 | Yamazaki et al. |
| 5,861,666 A | 1/1999 | Bellaar |
| 5,976,953 A | 11/1999 | Zavracky et al. |
| 6,022,760 A * | 2/2000 | Lebby et al. ............ 438/123 |
| 6,043,800 A | 3/2000 | Spitzer et al. |
| 6,118,502 A | 9/2000 | Yamazaki et al. |
| 6,127,199 A | 10/2000 | Inoue et al. |
| 6,133,626 A | 10/2000 | Hawke et al. |
| 6,208,521 B1 | 3/2001 | Nakatsuka |
| 6,226,050 B1 | 5/2001 | Lee |
| 6,226,060 B1 | 5/2001 | Onisawa et al. |
| 6,242,758 B1 | 6/2001 | Yamazaki et al. |
| 6,258,623 B1 | 7/2001 | Moden et al. |
| 6,265,772 B1 * | 7/2001 | Yoshida ............ 257/712 |
| 6,312,304 B1 | 11/2001 | Duthaler et al. |
| 6,372,608 B1 | 4/2002 | Shimoda et al. |
| 6,376,333 B1 | 4/2002 | Yamazaki et al. |
| 6,388,652 B1 | 5/2002 | Yamazaki et al. |
| 6,423,614 B1 | 7/2002 | Doyle |
| 6,441,474 B2 | 8/2002 | Naitoh et al. |
| 6,506,681 B2 | 1/2003 | Grigg et al. |
| 6,587,164 B2 | 7/2003 | Onisawa et al. |
| 6,589,811 B2 | 7/2003 | Sayyah |
| 6,597,113 B1 * | 7/2003 | Nitta ............ 313/581 |
| 6,627,518 B1 | 9/2003 | Inoue et al. |
| 6,677,621 B2 | 1/2004 | Yamazaki et al. |
| 6,737,300 B2 | 5/2004 | Ding et al. |
| 6,771,248 B2 * | 8/2004 | Tanaka et al. ............ 345/100 |
| 6,774,968 B2 | 8/2004 | Hagiwara |
| 6,778,164 B2 | 8/2004 | Yamazaki et al. |
| 6,780,677 B2 | 8/2004 | Imasu et al. |
| 6,781,152 B2 | 8/2004 | Yamazaki |
| 6,803,720 B2 | 10/2004 | Kwong et al. |
| 6,809,390 B2 | 10/2004 | Toda et al. |
| 6,830,494 B1 | 12/2004 | Yamazaki et al. |
| 6,846,703 B2 | 1/2005 | Shimoda et al. |
| 6,883,934 B2 | 4/2005 | Kawakami et al. |
| 6,897,841 B2 | 5/2005 | Ino |
| 6,897,912 B2 | 5/2005 | Kawakami et al. |
| 6,946,361 B2 | 9/2005 | Takayama et al. |
| 7,092,050 B2 | 8/2006 | Hanakawa et al. |
| 7,112,115 B1 | 9/2006 | Yamazaki et al. |
| 7,119,364 B2 | 10/2006 | Yamazaki |
| 7,119,801 B1 * | 10/2006 | Endo et al. ............ 345/204 |
| 7,122,896 B2 | 10/2006 | Saito et al. |
| 7,148,427 B2 | 12/2006 | Aruga et al. |
| 7,164,151 B2 | 1/2007 | Yamazaki et al. |
| 7,285,864 B2 | 10/2007 | Takyu et al. |
| 7,482,695 B2 | 1/2009 | Takyu et al. |
| 7,664,895 B2 * | 2/2010 | Nonoyama et al. ............ 710/71 |
| 7,746,333 B2 * | 6/2010 | Yamazaki et al. ............ 345/204 |
| 8,044,946 B2 * | 10/2011 | Yamazaki et al. ............ 345/204 |
| 2001/0002855 A1 | 6/2001 | Onisawa et al. |
| 2002/0024096 A1 | 2/2002 | Yamazaki et al. |
| 2002/0030189 A1 | 3/2002 | Ishikawa |
| 2002/0088984 A1 | 7/2002 | Toda et al. |
| 2002/0089634 A1 * | 7/2002 | Aruga et al. ............ 349/149 |
| 2002/0089984 A1 | 7/2002 | Jiang |
| 2002/0098612 A1 | 7/2002 | Ahn et al. |
| 2002/0105263 A1 | 8/2002 | Kim |
| 2002/0131007 A1 | 9/2002 | Yamazaki et al. |
| 2002/0146893 A1 | 10/2002 | Shimoda et al. |
| 2002/0180371 A1 | 12/2002 | Yamazaki et al. |
| 2003/0025118 A1 | 2/2003 | Yamazaki et al. |
| 2003/0032210 A1 | 2/2003 | Takayama et al. |
| 2003/0047280 A1 | 3/2003 | Takayama et al. |
| 2003/0047732 A1 | 3/2003 | Yamazaki et al. |
| 2003/0064569 A1 | 4/2003 | Takayama et al. |
| 2003/0082889 A1 | 5/2003 | Maruyama et al. |
| 2003/0098468 A1 * | 5/2003 | Wheeler et al. ............ 257/200 |
| 2003/0193545 A1 * | 10/2003 | Boucher et al. ............ 347/50 |
| 2003/0217805 A1 | 11/2003 | Takayama et al. |
| 2003/0231263 A1 * | 12/2003 | Kato et al. ............ 349/56 |
| 2004/0046909 A1 | 3/2004 | Sekiguchi |
| 2004/0087110 A1 | 5/2004 | Takayama et al. |
| 2004/0121516 A1 * | 6/2004 | Yamazaki et al. ............ 438/106 |
| 2004/0124542 A1 | 7/2004 | Kuwabara et al. |
| 2004/0140547 A1 * | 7/2004 | Yamazaki et al. ............ 257/686 |
| 2004/0212012 A1 | 10/2004 | Yamazaki et al. |
| 2004/0232413 A1 | 11/2004 | Yamazaki et al. |
| 2004/0238827 A1 | 12/2004 | Takayama et al. |
| 2007/0082430 A1 | 4/2007 | Yamazaki |

FOREIGN PATENT DOCUMENTS

| | | |
|---|---|---|
| EP | 1017100 A1 | 7/2000 |
| EP | 1039331 A2 | 9/2000 |
| EP | 1122794 A2 | 8/2001 |
| EP | 1243965 A1 | 9/2002 |
| EP | 1603163 A2 | 12/2005 |
| JP | 59219954 A | 12/1984 |
| JP | 60178424 A | 9/1985 |
| JP | 6244360 A | 9/1994 |
| JP | 8186156 A | 7/1996 |
| JP | 10-125929 A | 5/1998 |
| JP | 10-125930 A | 5/1998 |
| JP | 10-125931 A | 5/1998 |
| JP | 11-024106 A | 1/1999 |
| JP | 11-251517 A | 9/1999 |
| JP | 11-251518 A | 9/1999 |
| JP | 2000-004024 A | 1/2000 |
| JP | 2000-061785 A | 2/2000 |
| JP | 2000-267590 A | 9/2000 |
| JP | 2000-276068 A | 10/2000 |
| JP | 2000-294723 A | 10/2000 |
| JP | 2001-290439 A | 10/2001 |
| JP | 2002-049359 A | 2/2002 |
| JP | 2002-072233 A | 3/2002 |
| JP | 2002-189447 A | 7/2002 |
| JP | 3408154 B2 | 5/2003 |
| WO | WO 02/47457 A1 | 6/2002 |

OTHER PUBLICATIONS

Documents distributed in the "13th Flat Panel Display Manufacturing Technology Expo & Conference" by ELDis Group (5 pages); Jul. 2, 2003.

"Two-way display developed"; The Japan Times; (1 page); Jul. 3, 2003.

"Mass Production of Organic EL Devices"; Shimotsuke Newspaper (in Japanese with full translation); Jul. 3, 2003.

Kato et al.; Active Matrix Display Device and Manufacturing Method Thereof, Pub. No. US/20030231263A1, Pub. Date Dec. 18, 2003.

Watanab et al., "Anisotropic Conductive Films for Flat Panel Displays"; AM-LCD '96/IDW '96, Proceedings of the Third International Display Workshops, vol. 2, pp. 369-372 (Nov. 1996).

* cited by examiner

SEMICONDUCTOR DEVICE

CROSS-REFERENCE TO RELATED APPLICATIONS

This application is a continuation of U.S. application Ser. No. 13/276,350, filed Oct. 19, 2011, now allowed, which is a continuation of U.S. application Ser. No. 12/823,182, filed Jun. 25, 2010, now U.S. Pat. No. 8,044,946, which is a continuation of U.S. application Ser. No. 11/619,035, filed Jan. 2, 2007, now U.S. Pat. No. 7,746,333, which is a continuation of U.S. application Ser. No. 10/774,700, filed Feb. 10, 2004, now U.S. Pat. No. 7,164,151, which claims the benefit of a foreign priority application filed in Japan as Serial No. 2003-033194 on Feb. 12, 2003, all of which are incorporated by reference.

TECHNICAL FIELD

The present invention relates to a semiconductor device including a thin film transistor (TFT). In particular, the invention relates to a technique with which an integrated circuit is mounted on a panel including a pixel portion and a driving circuit.

BACKGROUND ART

In recent years, various technical developments of semiconductor devices that have thin film transistors (TFTs) formed from a semiconductor thin film (in a thickness range of substantially several to several hundreds nanometers) formed on the same substrate are forwarded.

Among such semiconductor devices, a structure in which on a substrate that becomes a panel not only a pixel portion but also a driving circuit as an internal circuit are integrally formed and an external circuit is formed outside of the panel (see Patent Document 1, for embodiment) is known.

On the other hand, when, in order to prepare a system on panel in which an external circuit is integrally formed, the external circuit is tried to mount on the panel, an area for the pixel portion and the driving circuit has to be reduced or a space for mounting the external circuit has to be disposed anew. As a result, there are problems in that not only the high definition and high-speed driving cannot be attained but also a panel becomes larger.

Patent Document 1

Japanese Patent Laid-Open N0. 2002-49359

Disclosure of the Invention

Problems that the Invention is to Solve

In this connection, the present invention intends to realize a narrower frame of a system on panel. Furthermore, the invention intends to make a system mounted on a panel highly functional or multi-functional.

Means for Solving the Problems

According to the invention, on a panel on which a pixel portion (including a liquid crystal element and a light-emitting element) and a driving circuit are formed, integrated circuits that have so far formed an external circuit are laminated and formed.

Specifically, of the pixel portion and the driving circuit on the panel, on a position that overlaps with the driving circuit, any one kind of the abovementioned integrated circuits or a plurality of kinds thereof is laminated and formed according to a transcription method. The pixel portion and the driving circuit on the panel may be ones that are formed according to the transcription method or ones that are directly formed on the substrate.

In the invention, integrated circuits that are different in the design rule or in function can be laminated and formed. Furthermore, as the transcription method that is used in the invention, a transcription technique including a method in which as shown in the specification an element formation layer formed on a substrate is peeled from the substrate in a metal oxide layer can be used. However, known techniques such as a transcription technique including a method in which after an amorphous silicon film including hydrogen is deposited on a substrate, laser light is irradiated to peel an element formation layer off the substrate or a transcription technique including a method in which a substrate on which an element formation layer is formed is etched with a solution or a gas or mechanically trimmed can be used. Here, a layer that is transcribed by use of the transcription technique is called an element formation layer; in the invention, a display controller, a memory controller, a CPU (Central Processing Unit), an MPU (Micro Processor Unit) and an integrated circuit such as a memory that are laminated and formed on the driving circuit on the panel by use of the transcription technique are included, and furthermore when the pixel portion (including liquid crystal element and light-emitting element) and the driving circuit on the substrate that constitute a panel are formed by use of the transcription technique, these are also included in the element formation layer.

Furthermore, an integrated circuit that is laminated and formed on the driving circuit is electrically connected with the driving circuit.

Thus, when a laminated circuit is formed by laminating one or two or more kinds of integrated circuits on a position that overlaps with the driving circuit on the panel, without particularly necessitating a space for forming integrated circuits, a plurality of integrated circuits different in the design rule (for instance, an integrated circuit according to a design rule of 0.35 to 1 µm and an integrated circuit according to a design rule of 1 to 50 µm and so on) and integrated circuits different in the function (for instance, a display controller, a memory controller, a CPU (Central Processing Unit), an MPU (Micro Processor Unit), a memory and so on) can be formed.

Still furthermore, since an element formation layer that is formed according to the transcription technique is 50 µm or less in its film thickness, even when a plurality of layers is laminated, an increase in an entire film thickness is not so much affected.

Furthermore, when an integrated circuit is laminated and formed on a position that overlaps with the driving circuit, in the case of an element that is formed in the pixel portion being a double-sided emission type, without affecting on the aperture ratio, a semiconductor device can be formed.

As mentioned above, in a configuration according to the invention, a semiconductor device including a pixel portion and a driving circuit on a substrate includes a laminated circuit at a position that overlaps with the driving circuit.

Furthermore, in a semiconductor device that has a pixel portion and a driving circuit on a substrate, the laminated circuit is disposed on a position that overlaps with the driving circuit and obtained by laminating an integrated circuit formed by transcribing an element formation layer formed on a separate substrate.

In the above configuration, the laminated circuit is electrically connected with an entirety or part of the pixel portion and the driving circuit, and an integrated circuit that constitutes the laminated circuit is any one of a display controller, a frame memory, a power source circuit, a CPU or a memory. Furthermore, the laminated circuit is formed by laminating an integrated circuit in one layer or two or more layers.

Furthermore, a semiconductor device in the invention is an active matrix type one or a passive matrix type one and includes a light-emitting element or a liquid crystal element in a pixel portion on a panel. In the case of the light-emitting element being included, a double-sided emission structure as well can be taken in which among a first electrode, an electroluminescent layer and a second electrode of a light-emitting element, the first electrode and the second electrode are formed of a translucent material, and thereby light generated in the electroluminescent layer is allowed exiting from both electrodes of the first electrode and the second electrode.

Effect of the Invention

In the present invention, by laminating an integrated circuit that has so far been formed outside of a panel on a driving circuit on the panel, narrow framing of a system-on-panel can be realized. Furthermore, thereby the higher functionality and multi-functionality of the system can be attained.

BEST MODE FOR CARRYING OUT THE INVENTION

In what follows, embodiment modes of the invention will be detailed. In what follows, embodiment modes of the invention will be explained with reference to the drawings. The present invention can be carried out in various different modes, and ones familiar in the art can easily understand that without deviating from a gist and a range of the present invention, forms and details thereof can be variously altered. Accordingly, the present invention should not be construed by restricting on descriptions of embodiment mode.

Figure 1:
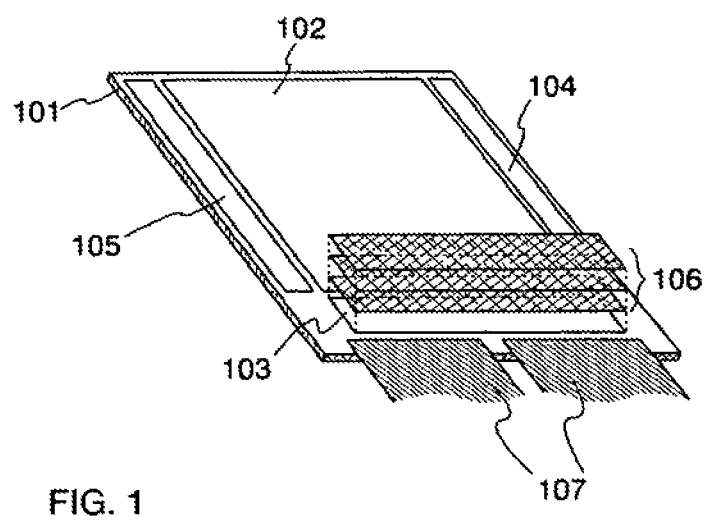
FIG. 1 is a diagram for explaining a configuration of the present invention.

FIG. 1 is a perspective view showing a configuration of a module of a semiconductor device formed according to the invention.

In a semiconductor device shown in FIG. 1, on a substrate 101, a pixel portion 102 and driving circuits (a source side driving circuit 103 and gate side driving circuits (104 and 105)) are formed, and on the source side driving circuit 103 a laminated circuit 106 that is formed by laminating a plurality of circuits is formed. Here, a case where the laminated circuit 106 is formed on the source side driving circuit 103 is shown. However, without restricting to the above, a configuration formed on the gate side driving circuits (104 and 105) can be adopted.

As integrated circuits included in the laminated circuit 106, a display controller, a frame memory, a power source circuit, a CPU, a memory controller, a memory or the like can be cited.

Furthermore, on the substrate 101, an FPC 107 is stuck, and an external signal is inputted through the FPC 107 to, in addition to the laminated circuit 106 as reference to above, the driving circuit or the pixel portion on the panel.

In the pixel portion on the panel, liquid crystal elements or light-emitting elements are formed. In the case of the light-emitting element being formed, a double-sided emission type light-emitting element that emits light from both surfaces of the panel also can be disposed.

In the invention, the laminated circuit 106 is formed, by use of a transcription technique, by sequentially laminating the respective circuits. However, not only the laminated circuit 106 but also the pixel portion and the driving circuit may be formed by use of the transcription technique.

Figure 2A:
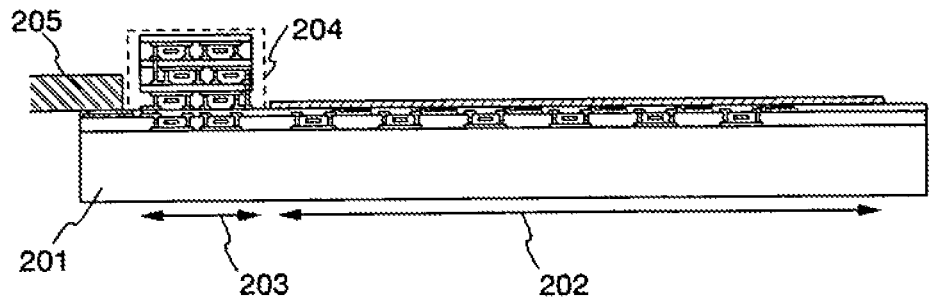
FIGS. 2A and 2B are diagrams for explaining a laminated circuit of the invention.

In the next place, the laminated circuit on the panel will be detailed. In FIG. 2A, a sectional view of a module of a semiconductor device formed according to the invention is shown.

On a substrate 201, a pixel portion 202 and a driving circuit 203 are formed, and on the driving circuit 203 a laminated circuit 204 is formed. On each of layers of the laminated circuit 204, a circuit is formed; when it is laminated according to the transcription technique, each thereof is formed so as to be in electrical connection.

Figure 2B:
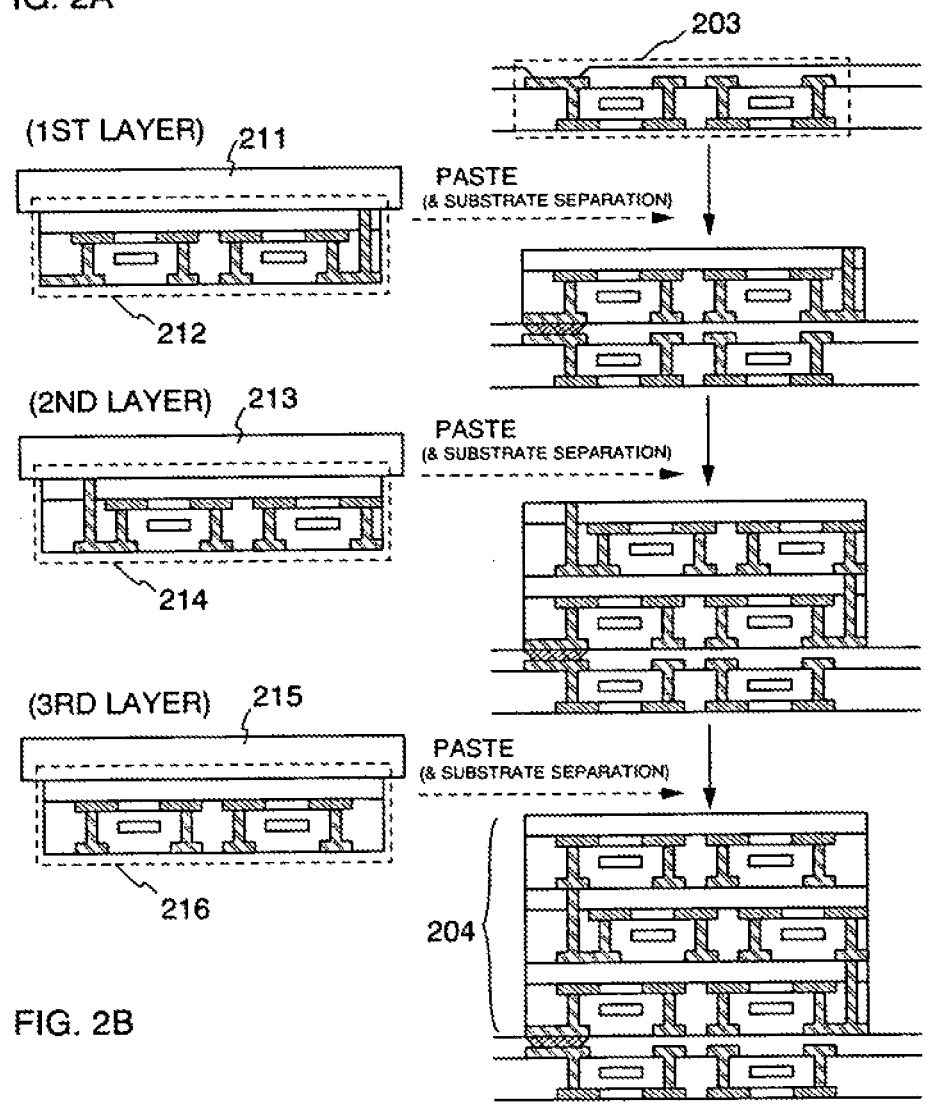

In FIG. 2B, manufacturing steps of the laminated circuit 204 are shown. That is, on the driving circuit 203 formed on the substrate 201, a first element formation layer 212 that is formed on a separate substrate (here, this is called a first substrate 211) and becomes a first layer is laminated according to the transcription technique. At this time, a wiring contained in the driving circuit 203 and a wiring contained in the first element formation layer 212 are connected so as to be in electrical connection.

After the first element formation layer 212 is transcribed on the driving circuit 203, the first substrate 211 is peeled from the first element formation layer 212. At this time, the wiring contained in the first element formation layer 212 is partially surfaced.

In the next place, on the first element formation layer 212, a second element formation layer 214 that is formed on a separate substrate (here, it is called as a second substrate 213) and becomes a second layer is laminated according to the transcription technique. At this time, a wiring contained in the first element formation layer 212 and a wiring contained in the second element formation layer 214 are connected so as to be in electrical connection.

After the second element formation layer 214 is transcribed on the first element formation layer 212, the second substrate 213 is peeled off the second element formation layer 214. At this time, a wiring contained in the second element formation layer 214 is partially surfaced.

Furthermore, on the second element formation layer 214, a third element formation layer 216 that is formed on a separate substrate (here, it is called as a third substrate 215) and becomes a third layer is laminated according to the transcription technique. At this time, the wiring contained in the second element formation layer 214 and a wiring contained in the third element formation layer 216 are connected so as to be in electrical connection.

Subsequently, the third element formation layer 216 is transcribed on the second element formation layer 214. In the case of the third element formation layer 216 here formed being the upper-most layer of the laminated circuit, the third substrate 215 is not necessarily peeled from the third element formation layer 216; that is, it may be peeled or not.

Thus, a laminated circuit 204 is formed on the driving circuit 203 of the panel. In the embodiment mode, a case where the laminated circuit 204 is made of three layers is shown. However, in the present invention, without restricting thereto, whatever layers may be laminated as far as more than one layer is laminated.

In what follows, embodiments of the invention will be explained.

[Embodiment 1]

Figure 3:
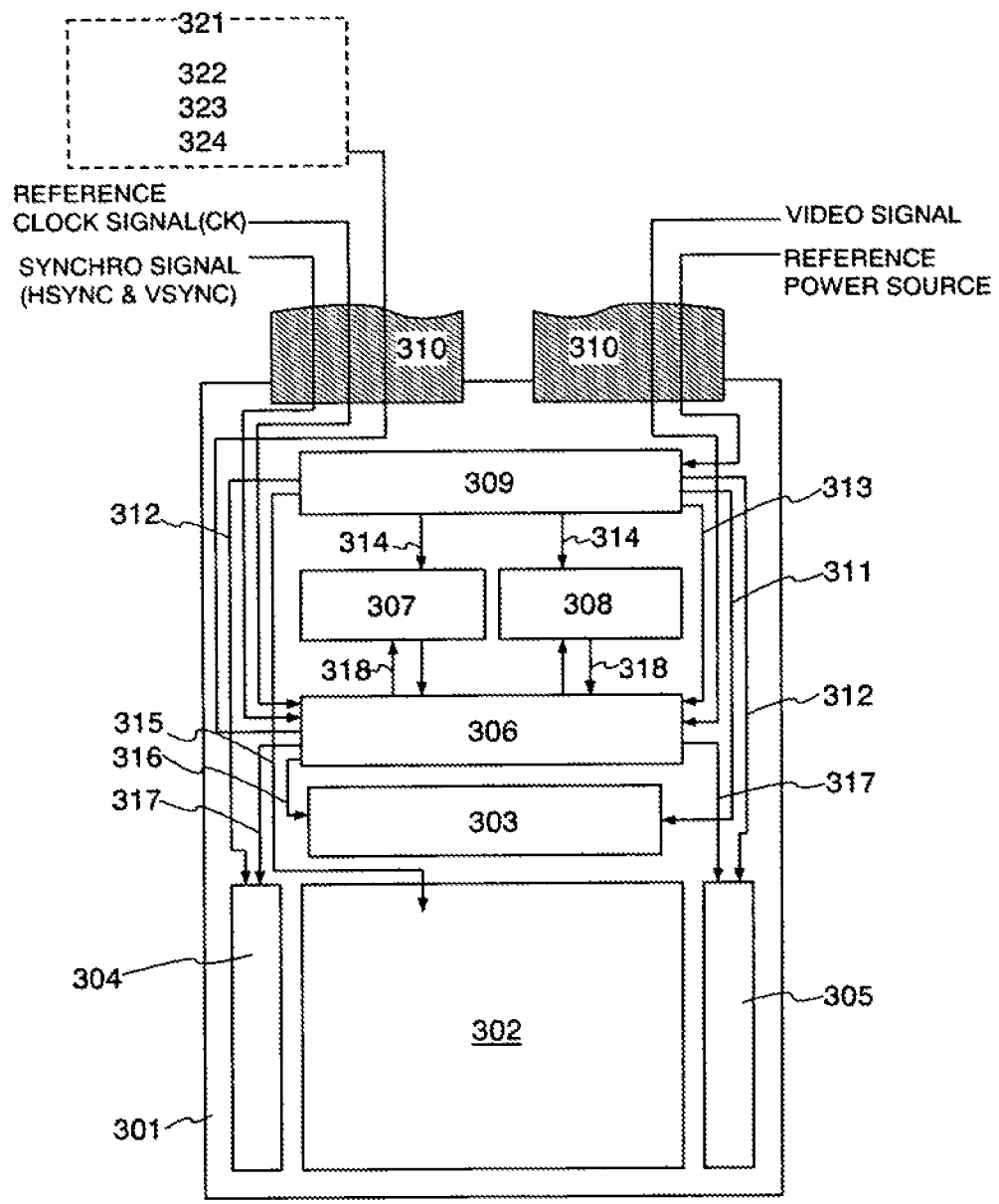
FIG. 3 is a block diagram for explaining a configuration of a panel of the invention.

In the embodiment, a configuration comprising a display controller and a power source circuit that are indispensable in carrying out image processing to a laminated circuit of the invention will be explained with reference to a block diagram shown in FIG. 3.

That is, on desired positions on a substrate 301, a pixel portion 302, a source side driving circuit 303 that is a driving circuit and gate side driving circuits (304 and 305) are formed. On the source side driving circuit 303, a display controller 306, a frame memory A (307), a frame memory B (308) and a power source circuit 309 are formed.

Wirings on the panel are connected through a FPC310 to a signal control circuit 321 (a CPU322, a memory controller 323 and a memory 324). Furthermore, through the FPC310, a reference clock signal (CK), a synchronous signal (HSYNC & VSYNC), a video signal and the like are inputted to the display controller 306, and a reference power source and so on are inputted to the power source circuit 309.

From the power source circuit 309, power sources of frame memory 314 are inputted in the frame memory A (307) and the frame memory B (308), respectively; a power source of source driving circuit 311 is inputted in the source side driving circuit 303; a power source of gate driving circuit 312 is inputted in the gate side driving circuit 305; a power source of display controller 313 is inputted in the display controller 306; and an element driving power source 315 is inputted in the pixel portion 302.

Furthermore, from the frame memories A (307) and B (308), frame memory read/write control signals 318 are inputted, respectively. Furthermore, from the display controller 306, a source side driving circuit clock signal with a start pulse 316 is inputted to the source side driving circuit 303 and a gate side driving circuit clock signal with a start pulse 317 is inputted to the gate side driving circuit 305.

In the next place, configurations of the display controller 306 and the power source circuit 309 will be explained with reference to FIGS. 4A and 4B.

Figure 4A:
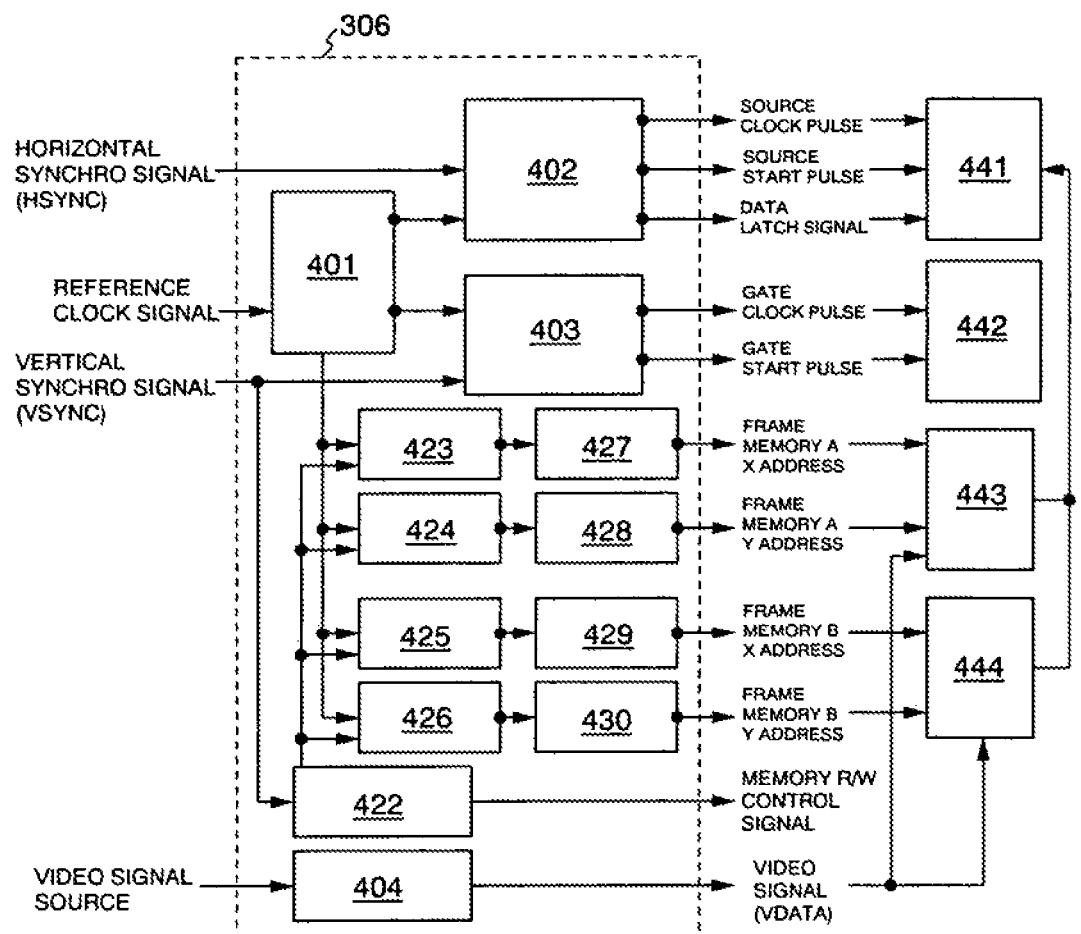
FIGS. 4A and 4B are diagrams for explaining a display controller and a power source circuit.

In FIG. 4A, the display controller 306 includes a divider 401, a horizontal clock generator 402, a vertical clock generator 403, a memory R/W control circuit 422, X-counters (423, 425), Y-counters (424, 426), X-decoders (427, 429), Y-decoders (428, 430) and a video signal processor 404.

In the divider 401, horizontal clock generator 402 and vertical clock generator 403, from externally inputted reference clock signal, horizontal synchronous signal (HSYNC) and vertical synchronous signal (VSYNC), a source side clock signal, source side start pulse, data latch signal, gate side clock signal, gate side start pulse and the like are generated.

Furthermore, in the memory R/W control circuit 422, writing-in or reading-out of the frame memory A and frame memory B is controlled. Still furthermore, the X-counters (423, 425), Y-counters (424, 426), X-decoders (427, 429) and Y-decoders (428, 430) select a memory address of each of the frame memory A (443) and frame memory B (444).

In the video signal processor 404, an externally inputted video signal source is converted into a video signal (VDATA) in a form corresponding to a driving method of a semiconductor device and supplied to a source side driving circuit 441 of the semiconductor device. As a video signal conversion, a conversion of an input order of data, D/A conversion, A/D conversion or the like can be mainly cited. Here, with a frame memory, a conversion of a data input order is performed.

Figure 4B:
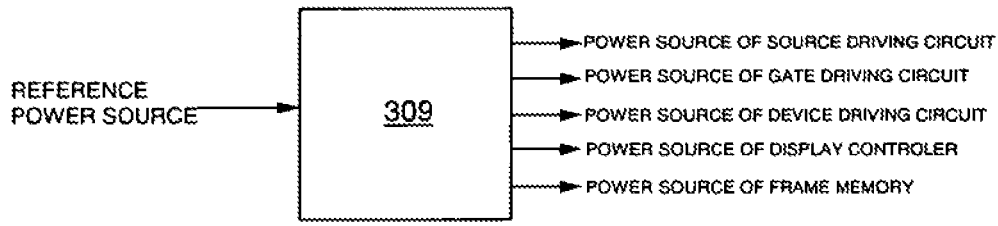

The power source circuit 309 shown in FIG. 4B, with an externally inputted reference power source, supplies power sources each of which has an appropriate potential. Here, a power source of source driving circuit for driving the source side driving circuit 441, a power source of gate driving circuit for driving a gate side driving circuit 442, an element power source for supplying a current to elements (light-emitting elements and so on) formed on the pixel portion, a power source of display controller for driving the display controller and a power source of frame memory for driving the frame memory are generated and supplied.

[Embodiment 2]

In the embodiment, a method of manufacturing a laminated integrated circuit will be detailed with reference to FIGS. 5 through 8.

Figure 5A:
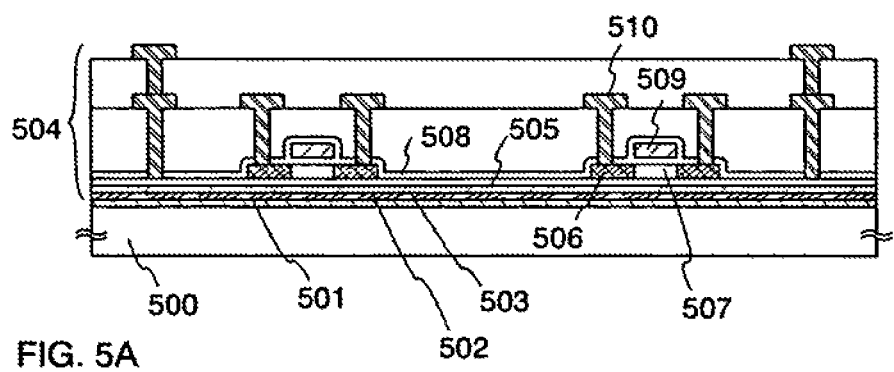
FIGS. 5A and 5B are diagrams for explaining a method of preparing a laminated integrated circuit.
Figure 5B:
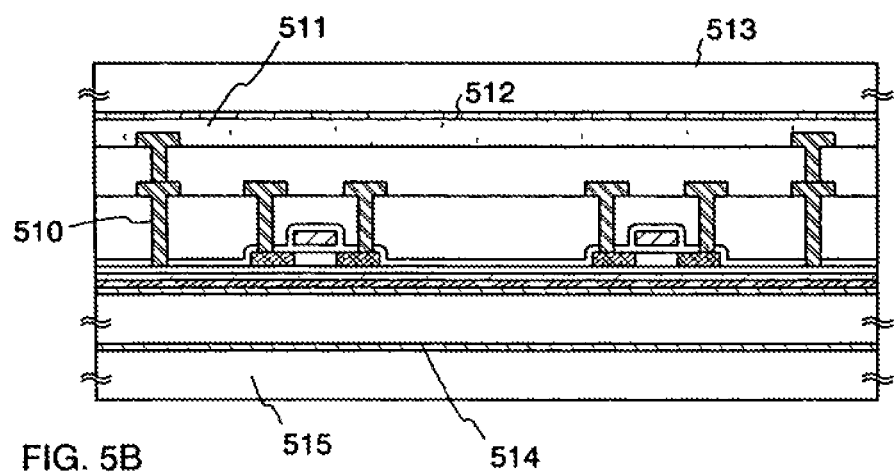

In FIG. 5A, a metal layer 501, a metal oxide layer 502 and an oxide layer 503 are sequentially formed on a first substrate 500, and further thereon an element formation layer 504 is formed.

As the first substrate 500, a glass substrate, a quartz substrate, a plastic substrate, a ceramics substrate, a silicon substrate, a metal substrate or a stainless steel substrate can be used. In the embodiment, AN100 that is a glass substrate is used.

As a material used for the metal layer 501 formed on the first substrate 500, a single layer made of an element selected from W, Ti, Ta, Mo, Nd, Ni, Co, Zr, Zn, Ru, Rh, Pd, Os, Ir and Pt or an alloy or a compound with the element as a main component or a laminate thereof, or a single layer made of a nitride thereof such as titanium nitride, tungsten nitride, tantalum nitride and molybdenum nitride or a laminate thereof may be used. A film thickness of the metal layer 501 has to be set in the range of 10 nm to 200 nm, and preferably in the range of 50 to 75 nm.

Now, in the case of the metal layer 501 being formed according to the sputtering method, the first substrate 500 is fixed; accordingly, a film thickness in the neighborhood of a periphery portion of the first substrate 500 is likely to be non-uniform. Accordingly, it is preferable to remove only the periphery portion by means of the dry etching. However, at this time, in order that the first substrate 500 may not be etched together, an insulating film made of a silicon oxide nitride film can be formed between the first substrate 500 and the metal layer 501 with a film thickness of substantially 100 nm.

On the metal layer 501, the metal oxide layer 502 and oxide layer 503 are formed. In the embodiment, a case where after the oxide layer 503 is formed, the metal layer 501 is partially oxidized in a later process to be a metal oxide layer 502 will be explained.

That is, here, as the metal layer 501, a layer made of tungsten (a film thickness is in the range of 10 to 200 nm, preferably in the range of 50 to 75 nm) is formed, and furthermore, without exposing to air, an oxide layer 503, here a silicon oxide layer (film thickness: 150 to 200 nm) is laminated thereon to form. A film thickness of the oxide layer 503 is desirably made two times or more the film thickness of the metal layer 501. For instance, by use of the sputtering method with a silicon oxide target, a silicon oxide film is preferably formed with a film thickness in the range of 150 to 200 nm.

Furthermore, an element formation layer 504 formed on the oxide layer 503 indicates a layer where an integrated circuit is formed by properly combining TFTs (p-channel type TFT, or n-channel type TFT). The TFTs shown here are formed of an impurity region 506 and a channel formation region 507 that are formed on part of a semiconductor film on an underlying film 505, a gate insulating film 508 and a gate electrode 509, and electrically connected through a wiring 510.

Still furthermore, when the element formation layer 504 is formed, after a film of a material containing at least hydrogen (semiconductor film or metal film) is formed, heat treatment is applied to diffuse hydrogen contained in the film of material containing hydrogen. The heat treatment has only to be applied at a temperature of 420 degree centigrade or more, may be carried out separately from a formation process of the element formation layer 504, or may be applied concurrently therewith and thereby omitted from applying. After as a film of a material containing hydrogen, for instance, an amorphous silicon film containing hydrogen is deposited according to a CVD method, when heat treatment is applied at a temperature of 500 degree centigrade or more to crystallize, owing to the heating a polysilicon film is formed and simultaneously hydrogen can be diffused.

When the heat treatment is applied, between the metal layer 501 and the oxide layer 503 a metal oxide layer 502 having a crystalline structure is formed. When the metal layer 501 and the oxide layer 503 are laminated to form, an amorphous metal oxide layer (tungsten oxide film) that has been formed between the metal film 501 and the silicon oxide film 502 with a thickness of substantially 2 to 5 nm also forms a crystalline structure owing to the heat treatment and is contained in the metal oxide layer 502.

In the embodiment, a case where in a step of forming part of the element formation layer, the metal oxide layer 502 is formed is explained. However, in the invention, without restricting to the method, a method where after the metal layer 501 is formed, the metal oxide layer 502 is formed, and the oxide layer 503 is formed may be adopted.

In the next place, on the element formation layer 504 an organic resin layer 511 is formed. As a material used for the organic resin layer 511, an organic material soluble in water or alcohols is used. This is coated over a whole area followed by curing, and thereby the organic resin layer is formed. As a composition of the organic material, any one of, for instance, epoxy, acrylate and silicone base resins can be used. Specifically, by means of a spin coat method, a water-soluble resin (VL-WSHL10 manufactured by Toagosei Co., Ltd.) (film thickness: 30 µm) is coated, followed by exposing for 2 min to tentatively cure, further followed by irradiating UV light for 2.5 min from a rear surface and 10 min from a front surface, in total for 12.5 min to cure completely, and thereby an organic resin layer 511 is formed.

In order to make later peeling easier, the adhesiveness of the metal oxide layer 502 is partially lowered. In order to partially lower the adhesiveness, laser light is partially irradiated to the metal layer 502 or the oxide layer 503 along a circumference of a region that is wanted to be peeled, or pressure is locally applied from the outside along a circumference of a region that is wanted to be peeled, and thereby part of the inside of a layer or of an interface of the oxide layer 503 is damaged. Specifically, with a diamond pen or the like, a hard needle has only to be pressed vertically to apply a weight and to be moved. Preferably, by use of a scriber, with an indentation amount set at 0.1 to 2 mm, pressure has only to be applied followed by moving. Thus, it is important to make, before the peeling, a portion that is likely to be easily peeled, that is, a trigger, and when pretreatment for selectively (partially) lowering the adhesiveness is applied, peeling fault can be removed and a yield can be improved.

In the next place, a first adhesive layer 512 is formed, and thereby a second substrate 513 can be stuck through the first adhesive layer 512 onto the organic resin layer 511. As the material for forming the first adhesive layer 511, known materials that can be lowered in the adhesiveness by applying a predetermined treatment in a later process can be used. In the embodiment, a case where a double-sided photosensitive tape that can be lowered in the adhesive force by irradiating light in a later process is used will be explained.

Furthermore, also in an exposed surface of the first substrate 500, a second adhesive layer 514 is formed, and through the second adhesive layer 514 a third substrate 515 is adhered. As a material that forms the second adhesive layer 514, similarly to the first adhesive layer 512, a double-sided tape is used. The third substrate 515 adhered here inhibits the first substrate 500 from being damaged in a later peeling step. As the second substrate 513 and third substrate 515, a substrate higher in the rigidity than the first substrate 500 such as a quartz substrate or a semiconductor substrate can be preferably used.

Figure 6A:
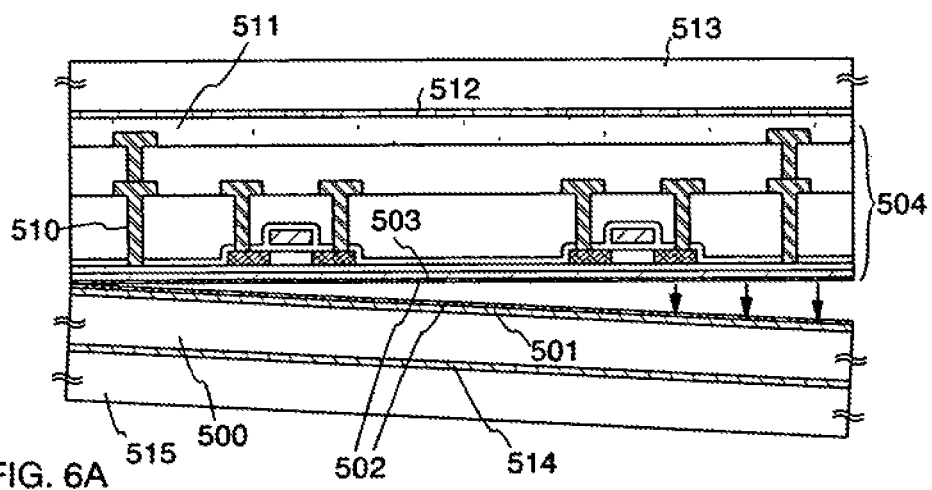
FIGS. 6A, 6B and 6C are diagrams for explaining a method of preparing a laminated integrated circuit.

Subsequently, starting to peel from a side of a region where the adhesiveness is partially lowered, the first substrate 500 provided with the metal layer 501 is peeled by use of physical means. In the case of the embodiment, the metal layer 501 and substrate 500 can be peeled in a portion of the metal oxide layer 502 with a relatively small force (for instance, human hand, wind pressure of a gas blown from a nozzle, supersonic and so on). Specifically, separation and peeling within a tungsten oxide film, or at an interface between a tungsten oxide film and a silicon oxide film, or at an interface between a tungsten oxide film and a tungsten film can be carried out. Thus, the element formation layer 504 formed on the oxide layer 503 can be peeled off the first substrate 500. A state at the peeling is shown in FIG. 6A.

Furthermore, on a surface exposed owing to the peeling, the metal oxide layer 502 partially remains. This causes the deterioration of the adhesiveness when the exposed surface is adhered to a substrate or the like in a later step; accordingly, the metal oxide layer 502 partially remained on the exposed surface is preferably removed. In order to remove these, an alkaline aqueous solution such as an ammonia aqueous solution or an acidic aqueous solution can be used. Other than the above, at a temperature (430 degree centigrade) where the metal oxide layer 502 is partially likely to be peeled or less, steps below may be applied.

Figure 6B:
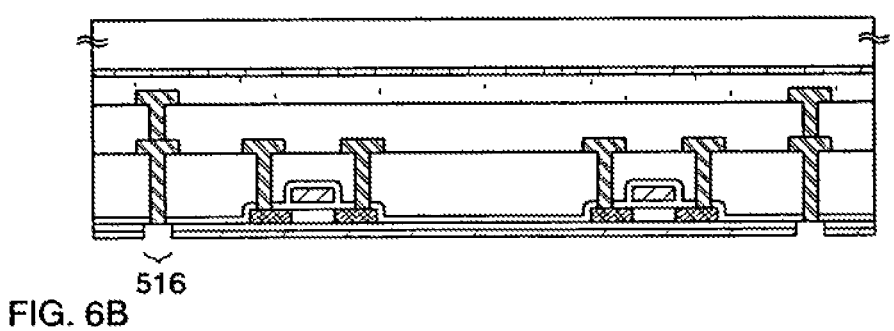

After the peeling and partial removing of the metal oxide layer 502, according to a patterning method with a mask due to the photolithography, an opening 516 that extends from a side of the oxide layer 503 exposed on a surface to the wiring 510 is formed (FIG. 6B).

Figure 6C:
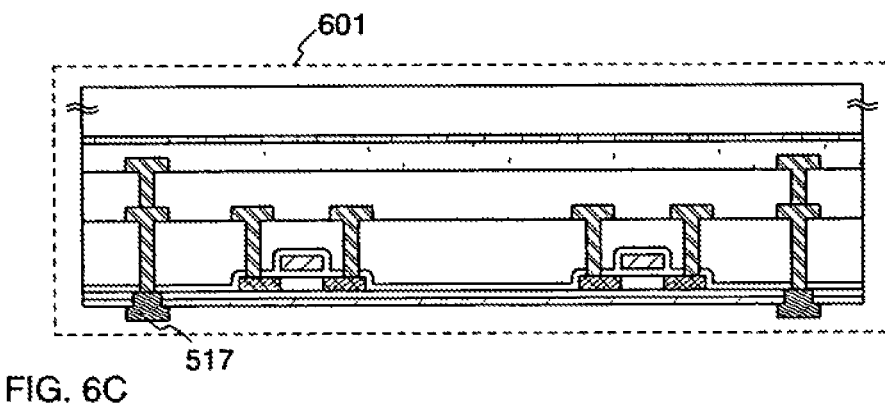

Then, in the formed opening 516, an auxiliary wiring 517 is formed, and thereby a structure (dotted line 601) shown in FIG. 6C is obtained. As the wiring material used here, an element selected from Ag, Au, Ta, W, Ti, Mo, Al and Cu, or alloys or compounds having the element as a main component can be cited. In the case of, in a later step, another element formation layer being formed superposed on the element formation layer stuck to the substrate, in this state (dotted line 601), the lamination is carried out.

Figure 7A:
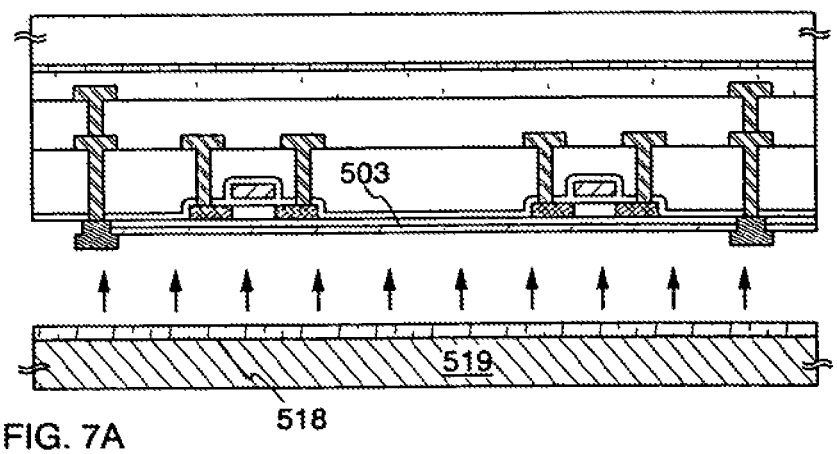
FIGS. 7A, 7B and 7C are diagrams for explaining a method of preparing a laminated integrated circuit.

In the next place, a third adhesive layer (anisotropically conductive adhesive layer) 518 is formed, and a fourth substrate 519 and the oxide layer 503 (and the element formation layer 504) are adhered through the third adhesive layer 518 (FIG. 7A). The fourth substrate 519 here indicates a substrate in which on a substrate made of a material such as a glass substrate, a quartz substrate, a ceramic substrate, a plastic substrate, a silicon substrate, a metal substrate or a stainless substrate a pixel portion and driving circuit have been formed. On a portion that overlaps with the driving circuit, the oxide layer 503 (and the element formation layer 504) is adhered. Thereby, a wiring formed on the driving circuit and a wiring formed on the element formation layer 504 and like are electrically connected through the auxiliary wiring 517 and the third adhesive layer (anisotropically conductive adhesive layer) 518.

In the embodiment, since an integrated circuit is laminated on the driving circuit, a substrate high in the thermal conductivity (for instance, a ceramic substrate having aluminum oxide (alumina), aluminum nitride, aluminum nitride oxide or silicon nitride as a main component) is preferably used.

Furthermore, it is important that the adhesiveness between the oxide layer 503 (and the element formation layer 504) and the fourth substrate 519 that are adhered with the third adhesive layer (anisotropically conductive adhesive layer) 518 is higher than that between the second substrate 513 and the organic resin layer 511 that are adhered with the first adhesive layer 512.

Still furthermore, as a material that is used for the third adhesive layer (anisotropically conductive adhesive layer) 518, one in which an anisotropic conductive material is dispersed in one of adhesives of various kinds of curing types such as a reaction curing adhesive, a thermosetting adhesive, a photocurable adhesive such as a UV curable adhesive, and an anaerobic adhesive can be used. As the anisotropic conductive material, one obtained by covering particles of a metal such as Ag, Au and Al with an insulating film can be used.

Figure 7B:
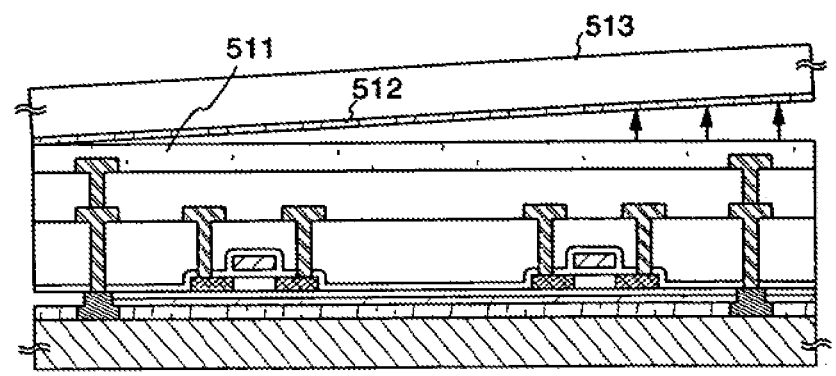

Subsequently, when UV light is irradiated from a side of the second substrate 513, the adhesive force of the double-sided tape used in the first adhesive layer 512 is lowered, and thereby the second substrate 513 is separated from the element formation layer 504 (FIG. 7B). Furthermore, when an exposed surface here is washed with water, the first adhesive layer 512 and organic resin layer 511 can be dissolved and removed.

In the embodiment, on an insulating film exposed on a surface, a thermally conductive film 520 is formed. The thermally conductive film 520 shown here is not necessarily required. However, since it can dissipate heat generated during drive and thereby inhibit the element and so on from causing fault owing to heat, it is preferably formed. As the thermally conductive film 520, a film of aluminum nitride, aluminum nitride oxide, diamond-like carbon (DLC) or the like can be used. These can be formed by use of a vapor phase deposition method such as a sputtering method, a reactive sputtering method, an ion beam sputtering method, an ECR (electron cyclotron resonance) sputtering method or an ionization deposition method.

Figure 7C:
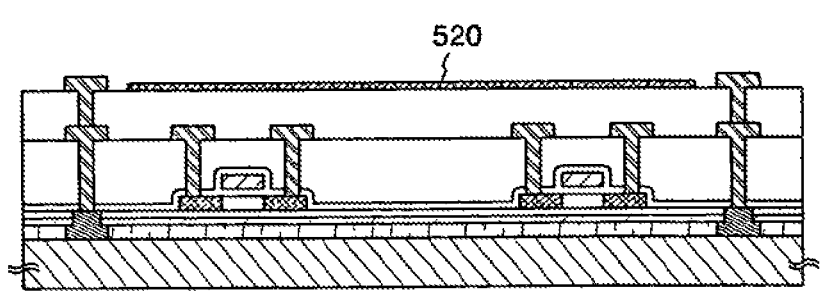

A state obtained by forming the thermally conductive film 520 is shown in FIG. 7C.

Figure 8A:
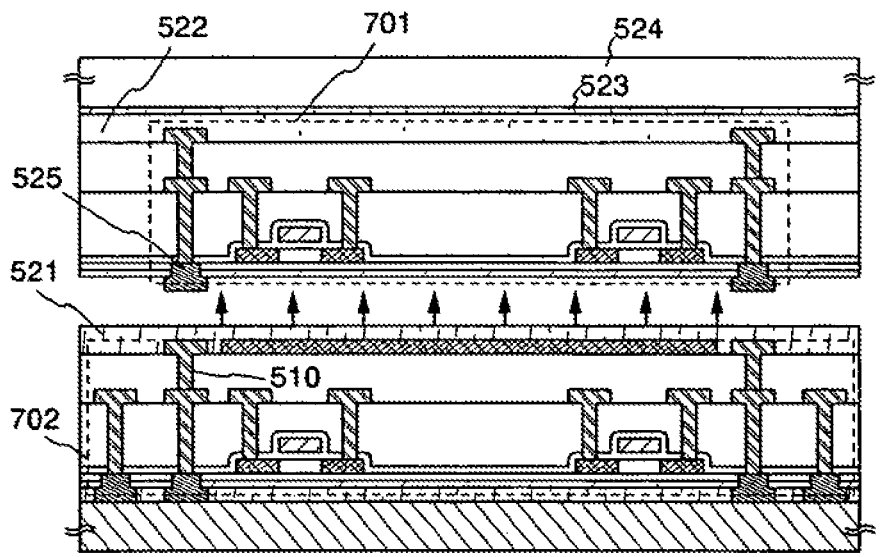
FIGS. 8A, 8B and 8C are diagrams for explaining a method of preparing a laminated integrated circuit.

In the next place, on the thermally conductive film 520 in FIG. 7C, a fourth adhesive layer 521 is formed. Through the fourth adhesive layer 521, a separate element formation layer that was obtained by undergoing steps up to FIG. 6C and has a state shown by the dotted line 601 is adhered (FIG. 8A). Here, the separate element formation layer having a state of the dotted line 601 in FIG. 6C is called a second element formation layer 701 and the element formation layer formed on the fourth substrate 519 is called a first element formation layer 702.

Furthermore, on the second element formation layer 701, an organic resin layer 522, fifth adhesive layer 523 and fifth substrate 524 are formed. In the case of the embodiment, when the respective element formation layers are laminated, the wiring 510 of the first element formation layer 702 and the auxiliary wiring 525 of the second element formation layer 701 are electrically connected through the fourth adhesive layer (anisotropically conductive adhesive layer) 521; accordingly, there is no problem when magnitudes (areas) of the respective element formation layers are the same or different each other.

Figure 8B:
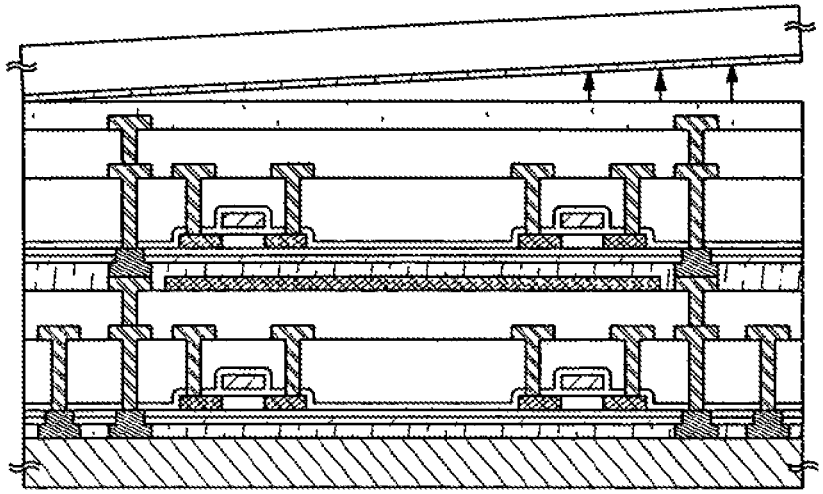

In the next place, when UV light is irradiated from a side of the fifth substrate 524, the adhesive force of a double-sided tape used in the fifth adhesive layer 523 is lowered, and thereby the fifth substrate 524 is separated from the second element formation layer 701 (FIG. 8B). Furthermore, when a surface exposed here is washed with water, the fifth adhesive layer 523 and the organic resin layer 522 can be dissolved and removed.

Figure 8C:
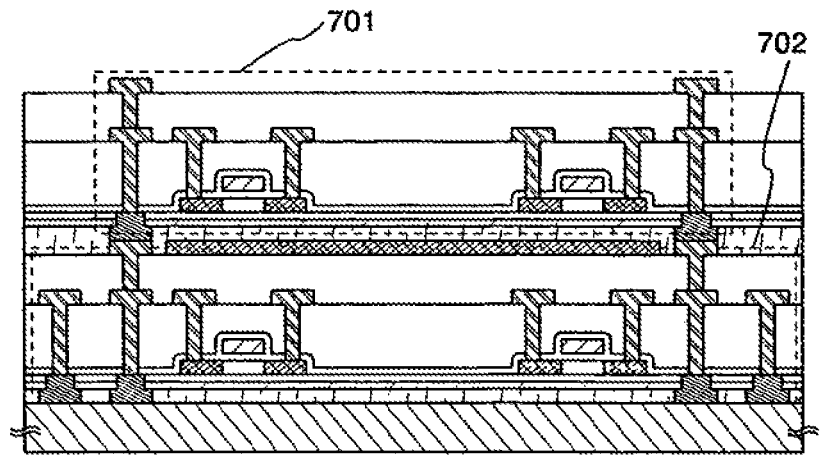

As described above, as shown in FIG. 8C, a structure where the first element formation layer 702 and the second element formation layer 701 are laminated can be formed. In the embodiment, a case where through a step of FIG. 8A, the organic resin layer 522, the fifth adhesive layer 523 and the fifth substrate 524 are removed and thereby a lamination structure shown in FIG. 8C is formed is explained. However, the invention, without restricting to the above, can take a structure that can be obtained by adhering in FIG. 8A.

[Embodiment 3]

In the present embodiment, a lamination structure of an integrated circuit that is different from that shown in embodiment 2 and can be obtained by, after a plurality of element formation layers are laminated, adhering a lastly laminated element formation layer on a driving circuit formed on a substrate will be explained with reference to FIGS. 9 and 10.

Figure 9A:
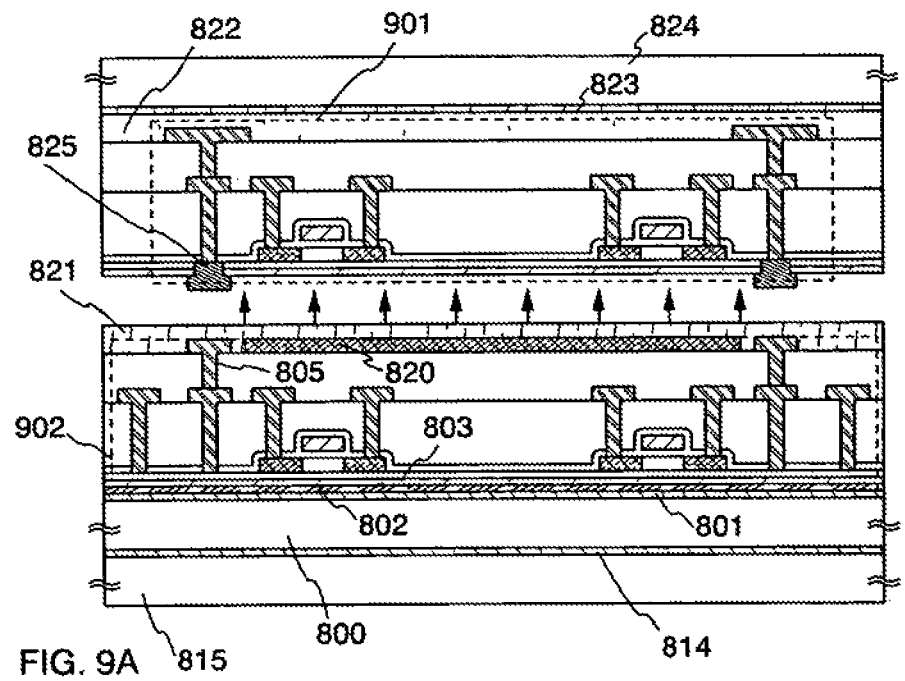
FIGS. 9A and 9B are diagrams for explaining a method of preparing a laminated integrated circuit.
Figure 10A:
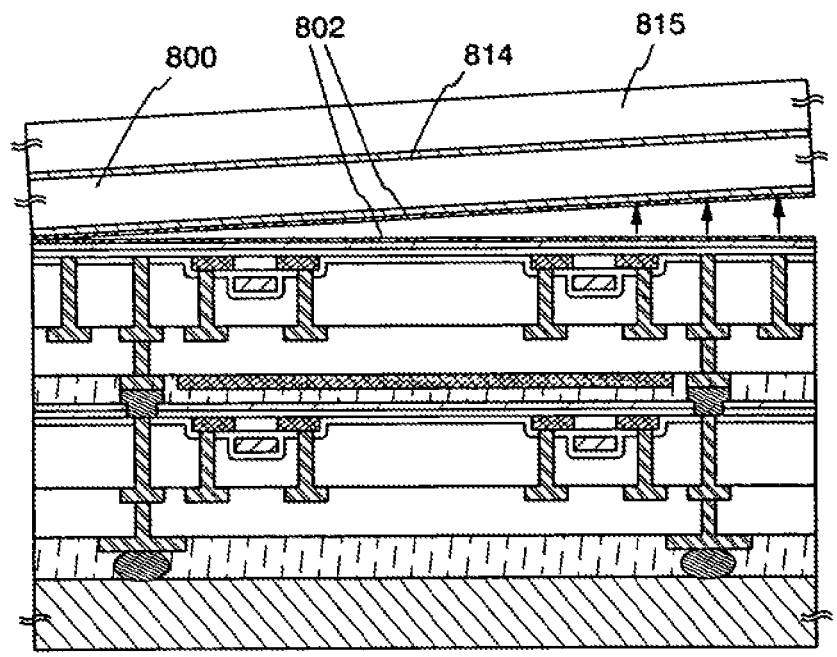
FIGS. 10A and 10B are diagrams for explaining a method of preparing a laminated integrated circuit.

As shown in FIG. 9A, on a first substrate 800 a first element formation layer 902 is formed, and further to the first substrate 800, through a second adhesive layer 814, a second substrate 815 is adhered.

In the embodiment, at this time, the first substrate 800, the second adhesive layer 814 and the second substrate 815 are not peeled in a metal oxide layer 802, and on a position that does not overlap with a wiring 805 on the first element formation layer 902, a thermally conductive film 820 is formed. The thermally conductive film 820 formed here has only to be formed with a material and according to a method similar to that used in the thermally conductive film 520 in embodiment 2.

In the next place, on the first element formation layer 902 thereon the thermally conductive film 820 is formed a first adhesive layer 821 (anisotropically conductive adhesive layer) is formed, followed by adhering a second element formation layer 901. The first adhesive layer 821 is an anisotropically conductive adhesive layer formed of an anisotropically conductive adhesive.

Furthermore, the second element formation layer 902 adhered here has a structure similar to that of the second element formation layer 701 shown in FIG. 8A of embodiment 2. That is, the second element formation layer 902 has an auxiliary wiring 825 that is electrically connected with the wiring formed in the second element formation layer 901 shown in FIG. 9 and has, on the wiring, an organic resin layer 822, a third adhesive layer 823 and a third substrate 824. The auxiliary wiring 825, when adhered with the first element formation layer, is electrically connected through the first adhesive layer 821 to the wiring 805 in the first element formation layer 902.

After the first element formation layer 902 and the second element formation layer 901 are adhered, from a third substrate 824 side, UV light is irradiated to lower the adhesive force of a double-sided tape used in the third adhesive layer 823, and thereby the third substrate 824 is separated from the second element formation layer 901. Furthermore, when an exposed surface here is washed with water, the third adhesive layer 823 and the organic resin layer 822 can be dissolved and removed.

Subsequently, a bump 826 is formed in contact with a wiring exposed on a surface of the second element formation layer 901 and adhered through a fourth adhesive layer 828 formed of an anisotropically conductive adhesive on a fourth substrate 827 having a driving circuit. Thereby, a wiring formed in the driving circuit on the fourth substrate 827 and a wiring exposed on a surface of the second element formation layer 901 are electrically connected through the bump 826. As a material that forms the bump 826, tungsten (W), tungsten-rhenium (W—Re), palladium (Pd), beryllium copper (BeCu) or the like can be used.

Figure 9B:
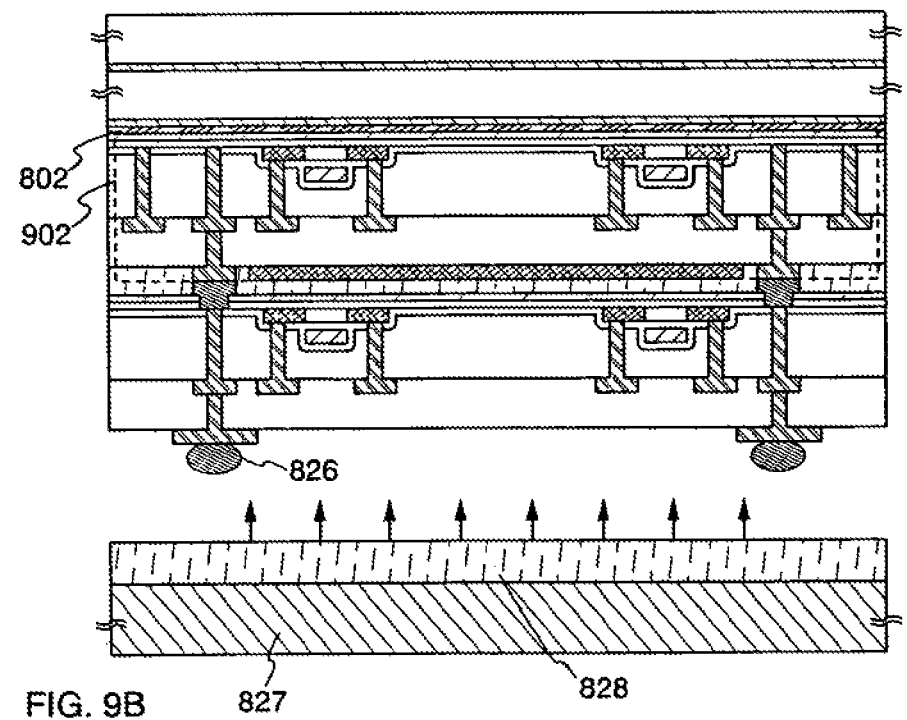

In FIG. 9B, a state where a lamination structure of the element formation layer shown in FIG. 9A is reversed is shown.

In the next place, similarly to that explained in FIG. 6A of embodiment 2, the metal layer 801 and the oxide layer 803 are physically peeled in the metal oxide layer 802 formed therebetween, and thereby the first substrate 800, the second adhesive layer 814 and the second substrate 815 are separated and removed.

Furthermore, in the embodiment, the metal oxide layer 802 present on the first element formation layer 902 shown in FIG. 9B is partially removed with an alkaline aqueous solution such an ammonia aqueous solution or an acidic aqueous solution. This treatment can be applied as needs arise.

Figure 10B:
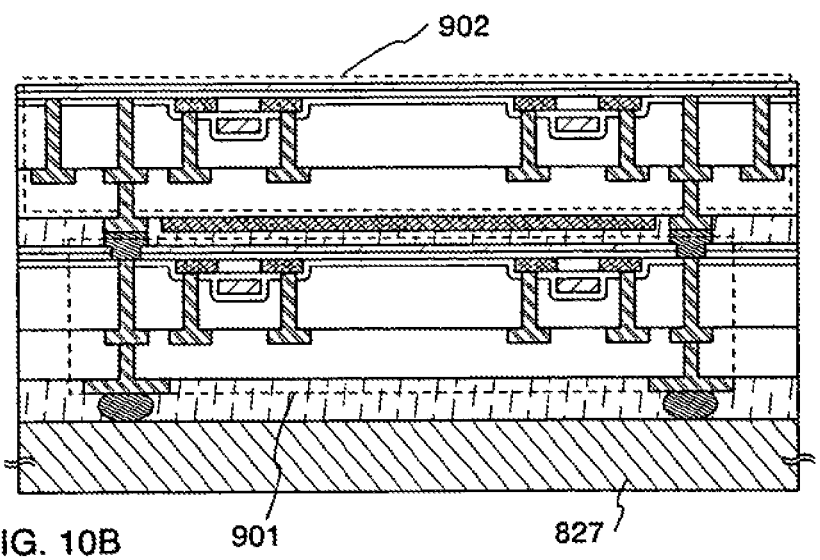

Thus, a shown in FIG. 10B, a structure (a structure different from that of embodiment 2) in which on the thermally conductive substrate (the fourth substrate 827) the second element formation layer 901 and the first element formation layer 902 are laminated can be formed.

[Embodiment 4]

Figure 11:
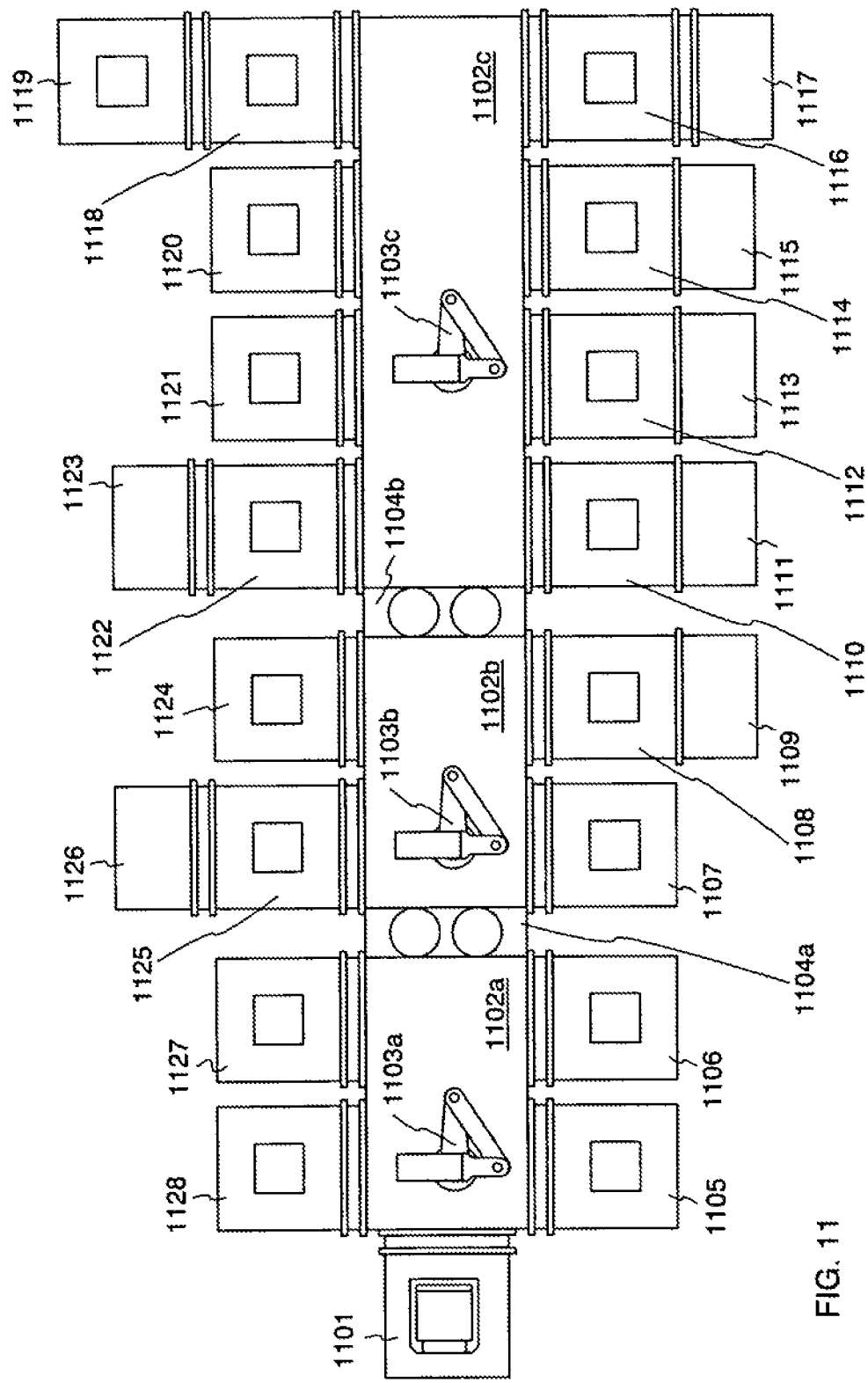
FIG. 11 is a diagram for explaining apparatus in which a transcription step is automated.

In the present embodiment, apparatus in which processes of preparing an integrated circuit shown in embodiment 2 are automated will be explained with reference to FIG. 11. As needs arise, names and reference numerals used in embodiment 2 will be referred to.

Firstly, in a cassette station 1101 a first substrate (substrate in a state shown in FIG. 5A) having an element formation layer are housed. Then, a first substrate is carried out of the cassette station 1101 with transfer means (A) 1103a provided to a transfer chamber (A) 1102a and transferred to a coating chamber (1) 1105. Subsequently, in the coating chamber (1) 1105, an organic resin is coated on the substrate. Furthermore, the first substrate is transferred to a UV irradiation chamber (1) 1106 with the transfer means (A) 1103a, UV light is irradiated on the previously coated organic resin, and thereby an organic resin layer is formed (see FIG. 5B).

In the next place, the first substrate is transferred from a delivery chamber (A) 1104a to a scribing chamber 1107 with transfer means (B) 1103b of a transfer chamber (B) 1102b. In the scribing chamber 1107, when the substrate is partially segmentalized with a scriber, the substrate can be easily peeled in a later step.

Subsequently, the first substrate is transferred to an adhesive formation chamber (1) 1108. In the embodiment, on the organic resin layer formed on the substrate, as an adhesive, a double-sided tape is adhered. (Thereby, the first adhesive layer 512 shown in embodiment 2 is formed.) Adjacent to the adhesive formation chamber (1) 1108, an adhesive supply chamber (1) 1109 that is provided with a reserved double-sided tape and can supply the double-sided tape is connected.

In the next place, the substrate is transferred from a delivery chamber (B) 1104b to a substrate pasting chamber (1) 1110 with transfer means (C) 1103c of a transfer chamber (C) 1102c. In the substrate pasting chamber (1) 1110, on the double-sided tape that is previously adhered on the substrate, a second substrate (the second substrate 513 in embodiment 2) can be newly adhered. Furthermore, adjacent to the substrate adhesion chamber (1) 1110, a substrate supply chamber (1) 1111 that is provided with substrates and can feed a substrate is connected.

Subsequently, the first substrate (to which the second substrate is adhered) is transferred to an adhesive formation chamber (2) 1112. In the embodiment, on a rear surface of the substrate a double-sided tape is adhered as an adhesive. (Thereby, the second adhesive layer 514 shown in embodiment 2 is formed.) Adjacent to the adhesive formation chamber (2) 1112, an adhesive supply chamber (2) 1113 that is provided with a reserved double-sided tape and can supply the double-sided tape is connected.

Then, the first substrate is transferred to a substrate pasting chamber (2) 1114. In the substrate pasting chamber (2) 1114, on the double-sided tape that is beforehand adhered on a rear surface of the substrate a third substrate (the third substrate 515 in embodiment 2) can be newly adhered. Adjacent to the substrate pasting chamber (2) 1114, a substrate supply chamber (2) 1115 that is provided with a substrate and can supply the substrate is connected.

Subsequently, the substrate is transferred to a peeling chamber (1) 1116. Here, as shown in FIG. 6A in embodiment 2, the first substrate and the third substrate are peeled. Adjacent to the peeling chamber (1) 1116, a substrate recovery chamber (1) 1117 that can recover the peeled first and third substrates is connected.

In the next place, the element formation layer (including the second substrate) therefrom the first and third substrates are peeled is transferred to a pattern formation chamber 1118 and an etching chamber 1119. In the pattern formation chamber 1118, a resist pattern is formed, followed by etching in the etching chamber 1119, and thereby as shown in FIG. 6B in embodiment 2, an opening is partially formed on a peeled surface. The opening is formed followed by transferring to a sputtering chamber 1120, and thereafter an auxiliary wiring is formed in the opening. Materials and so on used here in the wiring material have only to be referred to embodiment 2.

In the next place, the element formation layer (including the second substrate) is transferred to a coating chamber (2) 1121 and an adhesive is formed on a surface where the auxiliary wiring is formed. In the case of the embodiment, as an adhesive, a water-insoluble anisotropically conductive adhesive is formed by means of a coating method; however, it can be formed also by a printing method. Furthermore, in the case of embodiment 2, a case where an adhesive is formed on the fourth substrate and this is adhered to the element formation layer is shown; however, as shown in the present embodiment, a method in which an adhesive is formed on a side of the element formation layer, and this is adhered to the fourth substrate can be also used.

Then, the element formation layer is transferred to a substrate pasting chamber (3) 1122. Here, the element formation layer (including the second substrate) is adhered to the fourth substrate with a water-insoluble anisotropically conductive adhesive. The fourth substrate in this case, in the case of an element formation layer that is to be adhered being a first layer of an integrated circuit, indicates a substrate thereon a driving circuit is formed; however, in the case of an element formation layer that is to be adhered being a second layer of the integrated circuit, it indicates a substrate thereon a driving circuit and a first layer integrated circuit are formed. Furthermore, adjacent to the substrate pasting chamber (3) 1122, a substrate supply chamber (3) 1123 that is provided with such the fourth substrate is connected.

In the next place, the substrate is transferred from the delivery chamber (B) 1104b, by means of a transferring unit (B) 1103b of the transfer chamber (B) 1102b, to a UV irradiation chamber (2) 1124. In the UV irradiation chamber (2) 1124, when UV light is irradiated on the double-sided tape (the first adhesive layer 512 in embodiment 2) adhered previously on the substrate, the adhesive force of the double-sided tape can be lowered.

Subsequently, in the peeling chamber (2) 1125, as shown in FIG. 7B in embodiment 2, the second substrate that is adhered with weakened adhesive force is peeled. Adjacent to the peeling chamber (2) 1125, a substrate recovery chamber (2) 1126 that can recover the peeled second substrate is connected.

Subsequently, in an adhesive removing chamber 1127, the double-sided tape that adheres the second substrate is removed. As shown in embodiment 2, when together with the second substrate the double-sided tape is removed, the treatment in the adhesive removing chamber 1127 can be omitted.

Then, in a cleaning chamber 1128, the organic resin layer exposed by removing the second substrate and the double-sided tape is washed with water. Since the organic resin that forms the organic resin layer is water-soluble, it can be removed by washing with water.

By use the apparatus shown in the present embodiment, the integrated circuit having the lamination structure shown in embodiment 2 can be automatically manufactured. In the apparatus shown in the embodiment, since the transfer chambers are plurally disposed by separating owing to the delivery chambers, treatments can be simultaneously carried out in different transfer chambers, resulting in an improvement in the throughput. In the embodiment, a case where there are two delivery chambers and three transfer chambers is shown; however, without restricting thereto, there may be two transfer chambers or four or more transfer chambers.

[Embodiment 5]

Figure 12A:
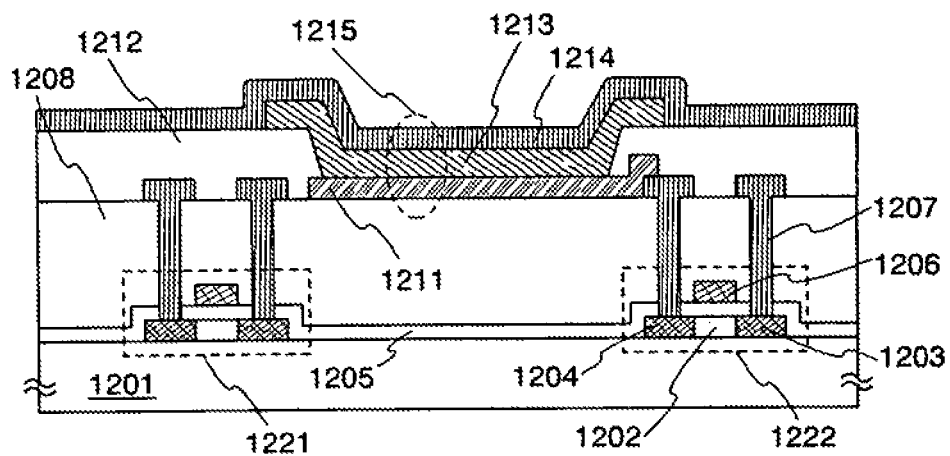
FIGS. 12A, 12B and 12C are diagrams for explaining a configuration of a light-emitting element formed in a pixel portion.
Figure 12B:
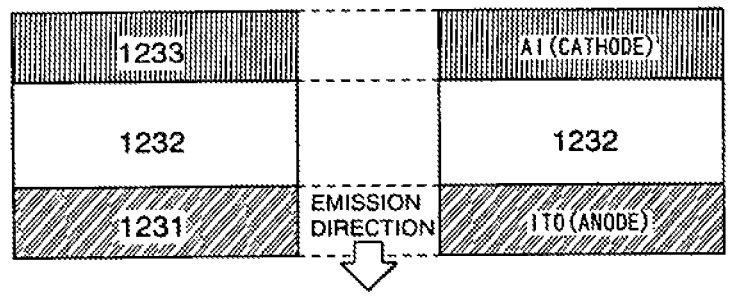
Figure 12C:
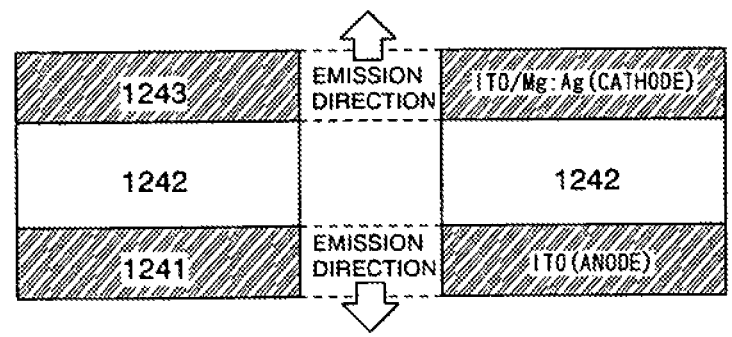

In the present embodiment, an element structure when a light-emitting element is formed in a pixel portion of a panel will be explained with reference to FIGS. 12A through 12C. FIG. 12A is a diagram showing a sectional structure of a light-emitting element in a pixel portion, and FIGS. 12B and 12C are diagrams showing an element structure of the light-emitting element. The light-emitting element shown here is constituted of a first electrode electrically connected to a current control TFT and a second electrode formed with an electroluminescent layer interposed therebetween.

In FIG. 12A, thin film transistors (TFTs) are formed on a substrate 1201. Here, a current control TFT 1222 that is electrically connected with a first electrode 1211 of a light-emitting element 1215 and has a function of controlling a current supplied to the light-emitting element 1215, and a switching TFT 1221 that controls a video signal that is inputted to a gate electrode of the current control TFT 1222 are shown.

As the substrate 1201, a silicon substrate having the light blocking property is used; however, a glass substrate, a quartz substrate, a resin substrate and a flexible substrate material (plastic) may be used. Furthermore, an active layer of each of the TFTs has at least a channel formation region 1202, a source region 1203 and a drain region 1204.

Still furthermore, an active layer of each of the TFTs is covered with a gate insulating film 1205 and a gate electrode 1206 that overlaps through the gate insulating film 1205 with the channel formation region 1202 is formed. Furthermore, an interlayer insulating film 1208 is disposed with the gate electrode 1206 covered. As a material that forms the interlayer insulating film 1208, other than silicon-containing insulating films such as silicon oxide, silicon nitride and silicon nitride oxide, organic resin films such as polyimide, polyamide, acrylic (including photosensitive acrylic) and BCB (benzocyclobutene) can be used.

In the next place, on the interlayer insulating film 1208, a wiring 1207 electrically connected with the source region 1203 of the current control TFT 1222, and the first electrode 1211 electrically connected with the drain region 1204 are disposed. In the case of the first electrode 1211 being an anode, the current control TFT 1222 is formed of a p-channel type, and in the case of the first electrode 1211 being a cathode, the current control TFT 1222 is preferably formed with a p-channel type.

Furthermore, with an end portion of the first electrode 1211, the wiring 1207 and so on covered, an insulating layer 1212 is formed. In the next place, on the first electrode 1211, an electroluminescent layer 1213 is formed, thereon a second electrode 1214 is formed, and thereby a light-emitting element 1215 comes to completion.

In the embodiment, materials of the first electrode 1211 and second electrode 1214 can be appropriately selected. However, in the case of an electrode that is functioned as an anode being formed, it is generally preferable to use a conductive material with a large work function (for instance, the work function is 4.0 eV or more), and in the case of an electrode that is functioned as a cathode being formed, it is generally preferable to use a conductive material with a small work function (for instance, the work function is 3.5 eV or less). Furthermore, in the case of an electrode that allows light generated in an electroluminescent layer going through being formed, it is necessary to form an electrode with a light transmitting material. In this case, only one of the electrodes may be formed of a light transmitting material and the other may be formed of a light blocking material; however, when both electrode materials are formed of light transmitting materials, a light-emitting element that can exit light from both electrodes can be formed.

Furthermore, in a light-emitting element shown in FIG. 12A, holes are injected from an electrode that works as an anode into the electroluminescent layer 1213 and electrons are injected from an electrode that works as a cathode into the electroluminescent layer 1213. Thereby, in the electroluminescent layer 1213, the holes and electrons are recombined to generate luminescence.

Still furthermore, the electroluminescent layer 1213 can be formed by laminating by combining at least a light-emitting layer and any one or a plurality of layers different in function to carriers such as a hole injection layer, a hole transporting layer, a blocking layer, an electron transporting layer and an electron injection layer.

As the material that forms the electroluminescent layer 1213, low molecular weight, high molecular weight or medium molecular weight known organic compounds can be used. The medium molecular weight organic compound here indicates a material that does not sublimate, has a number of molecules of 20 or less or is 10 μm or less in a length of linked molecules.

As the material that forms the electroluminescent layer 1213, specifically materials below can be used.

As the hole injection material that forms a hole injection layer, as organic compounds, porphyrin base compounds such as phthalocyanine (hereinafter, referred to as $H_2$-Pc) and copper phthalocyanine (hereinafter referred to as Cu-Pc) can be cited as effective. There are materials in which a conductive polymer compound is chemically doped, and polystyrene sulfonate (hereinafter, referred to as PSS)-doped polyethylene dioxythiophene (hereinafter, referred to as PEDOT), polyaniline and polyvinyl carbazole (hereinafter, referred to as PVK) can be cited.

As the hole transporting material that forms the hole transporting layer, aromatic amine base (that is, ones that have a bond of a benzene ring-nitrogen) compounds are preferable. As widely used materials, for instance, other than the abovementioned TPD, an derivative thereof, that is, 4,4'-bis[N-(1-naphtyl)-N-phenyl-amino]-biphenyl (hereinafter, referred to as [α-NPD]), and star-burst aromatic amine compounds such as 4,4',4"-tris(N,N-diphenyl-amino)-triphenylamine (hereinafter, referred to as [TDATA]) and 4,4', 4"-tris[N-(3-methylphenyl)-N-phenyl-amino]-triphenylamine (herein after, referred to as [MTDATA]) can be cited.

As the luminescent materials that form the light-emitting layer, specifically, other than metal complexes such as tris(8-quinolinolate)aluminum (hereinafter, referred to as $Alq_3$), tris(4-methyl-8-quinolinolate)aluminum (hereinafter, referred to as $Almq_3$), bis(10-hydroxybenzo[h]-quinolinate) beryllium (hereinafter, referred to as $BeEq_2$), bis(2-methyl-8-quinolinorate)-(4-hydroxy-biphenylyl)-aluminum (hereinafter, referred to as BAlq), bis[2-(2-hydroxyphenyl)-benzoxazolate]zinc (hereinafter, referred to as $Zn(BOX)_2$), and bis[2-(2-hydroxyphenyl)-benzothiazolate]zinc (hereinafter, referred to as $Zn(BTZ)_2$), various kinds of fluorescent dyes are effective. Furthermore, triplet luminescent materials can be used, and in this case complexes having platinum or iridium as a metal center are mainly used. As the triplet luminescent materials, tris(2-phenylpyridine)iridium (hereinafter, referred to as $Ir(ppy)_3$), 2,3,7,8,12,13,17,18-octaethyl-21H,23H-porphyrin-platinum (hereinafter, referred to as PtOEP) and so on are known.

As electron transporting materials that form the electron transporting layer, metal complexes are widely used, these preferably including metal complexes having a quinoline skeleton or a benzoquinoline skeleton such as abovementioned $Alq_3$, $Almq_3$ and $BeBq_2$ and BAlq that is a mixed ligand complex. Furthermore, there are metal complexes having a oxazole- or thiazole-base ligand such as $Zn(BOX)_2$ or $Zn(BTZ)_2$. Furthermore, other than the metal complexes, oxadiazole derivatives such as 2-(4-biphenylyl)-5-(4-tert-butylphenyl)-1,3,4-oxadiazole (hereinafter, referred to as PBD) and 1,3-bis[5-(p-tert-butylphenyl)-1,3,4-oxadiazole-2-yl]benzene (hereinafter, referred to as OXD-7); triazole derivatives such as 3-(4-tert-butylphenyl)-4-phenyl-5-(4-biphenylyl)-1,2,4-triazole (hereinafter, referred to as TAZ) and 3-(4-tert-butylphenyl)-4-(4-ethylphenyl)-5-(4-biphenylyl)-1,2,4-triazole (hereinafter, referred to as p-EtTAZ); and phenanthroline derivatives such as basophenanthroline (hereinafter, referred to as BPhen) and basocuproin (hereinafter, referred to as BCP) have the electron transporting property.

Other than the above, in the case of a blocking layer being included, as hole blocking materials that form a blocking layer, because excitation energy level is high, abovementioned BAlq, OXD-7, TAZ, p-EtTAZ, BPhen and BCP are effective.

In FIG. 12B, a configuration of a case where the first electrode 1231 is an anode made of a light transmissive material and the second electrode 1233 is a cathode formed of a light blocking material is shown. In this case, the first electrode 1231 can be formed with a transparent conductive film such as a indium tin oxide (ITO) film, a transparent conductive film in which 2 to 20 percent of zinc oxide (ZnO) is mixed with indium oxide (IZO or $In_2O_3$—ZnO), or a transparent conductive film in which 0.5 to 20 percent of silicon oxide ($SiO_2$) is mixed with ITO (ITO—$SiO_2$). The second electrode 1233 can be formed by use of Al, Ti, W or the like. Here, a case where ITO is used in the first electrode 1231 and Al is used in the second electrode 1233 is shown. Light generated in the electroluminescent layer 1232 is exited from a side of the first electrode 1231. In the configuration, the material that forms the electroluminescent layer 1232 can be appropriately selected from above-shown materials and used.

The present invention is not restricted to the above configuration. That is, the first electrode 1231 can be formed of a light blocking anode and the second electrode 1233 can be formed so as to be a translucent cathode. In this case, light is exited from a side of the second electrode 1232.

In FIG. 12C, a configuration of a case where both of the first electrode 1241 and second electrode 1243 are formed of a translucent material, the first electrode is an anode and the second electrode is a cathode is shown. In this case, the first electrode 1241 can be formed, similarly to the case shown in FIG. 12B, with a transparent conductive film such as a indium tin oxide (ITO) film, a transparent conductive film in which 2 to 20 percent of zinc oxide (ZnO) is mixed with indium oxide (IZO or $In_2O_3$—ZnO), or a transparent conductive film in which 0.5 to 20 percent of silicon oxide ($SiO_2$) is mixed with ITO (ITO—$SiO_2$). The second electrode 1243 can be formed by laminating Mg:Ag (alloy of magnesium and silver) that is a material with a small work function, and ITO. In this case, light generated in the electroluminescent layer 1242 is exited from both sides of the first electrode 1241 and the second electrode 1243. Even in this configuration, a material that constitutes the electroluminescent layer 1242 can be appropriately selected from the previously shown materials and used.

Furthermore, in the embodiment, separately from the configuration shown in FIG. 12C, a configuration in which light is exited from both of the first and second electrodes will be explained with reference to FIGS. 13A and 13B.

Figure 13A:
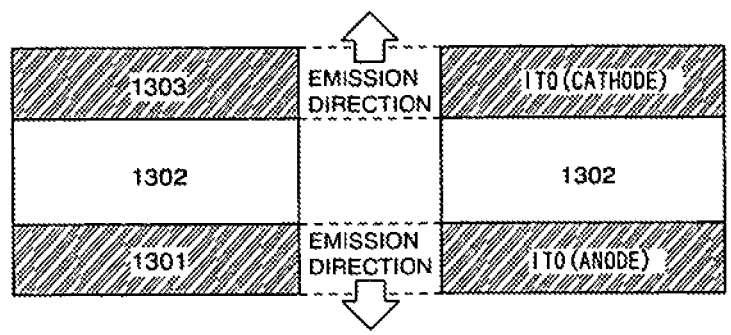
FIGS. 13A and 13B are diagrams for explaining a configuration of a light-emitting element formed in a pixel portion.

As shown in FIG. 13A, in spite of a first electrode 1301 being an anode and a second electrode 1303 being a cathode, both are made of ITO. However, in this case, there is a feature in a structure of an electroluminescent layer 1302. That is, as shown in FIG. 13B, an electroluminescent layer that is formed adjacent to a first electrode 1303 that is a cathode has a doped layer 1304 in which an alkali metal such as Li or Cs that has a small work function is doped. Since thereby the work function of the electroluminescent layer 1302 on a cathode side can be made smaller, even when ITO is used in an electrode material of the second electrode 1303 that is a cathode, it can be functioned as a cathode.

Figure 13B:
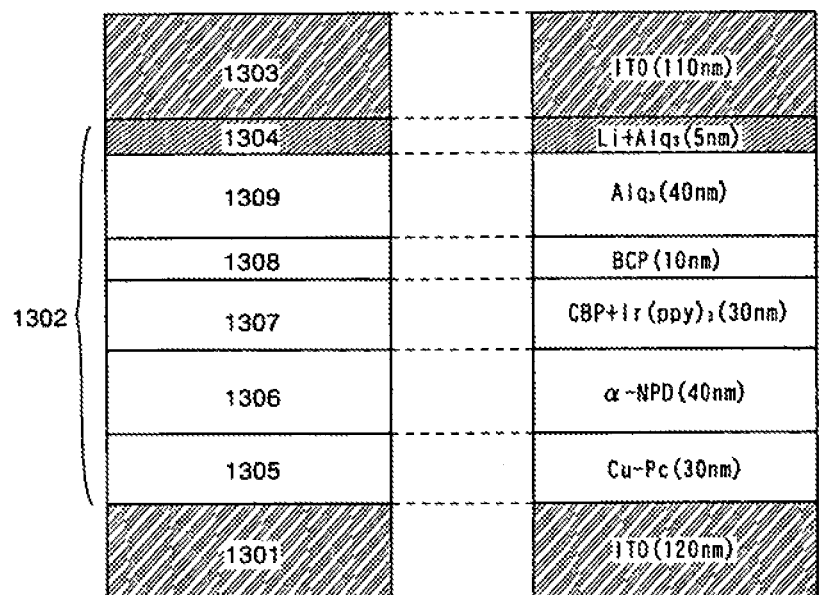

In FIG. 13B, a case where the electroluminescent layer 1302 is formed by laminating a hole injection layer 1305, a hole transporting layer 1306, a light-emitting layer 1307, a blocking layer 1308, an electron transporting layer 1309 and a doped layer 1304 is shown. However, in a lamination configuration other than that in which a doped layer is formed in the electroluminescent layer 1302 in contact with the second electrode 1303, abovementioned materials can be appropriately selected and used.

[Embodiment 6]

In the present embodiment, an element configuration of a case where a liquid crystal element is formed in a pixel portion of a panel will be explained with reference to FIG. 14.

Figure 14:
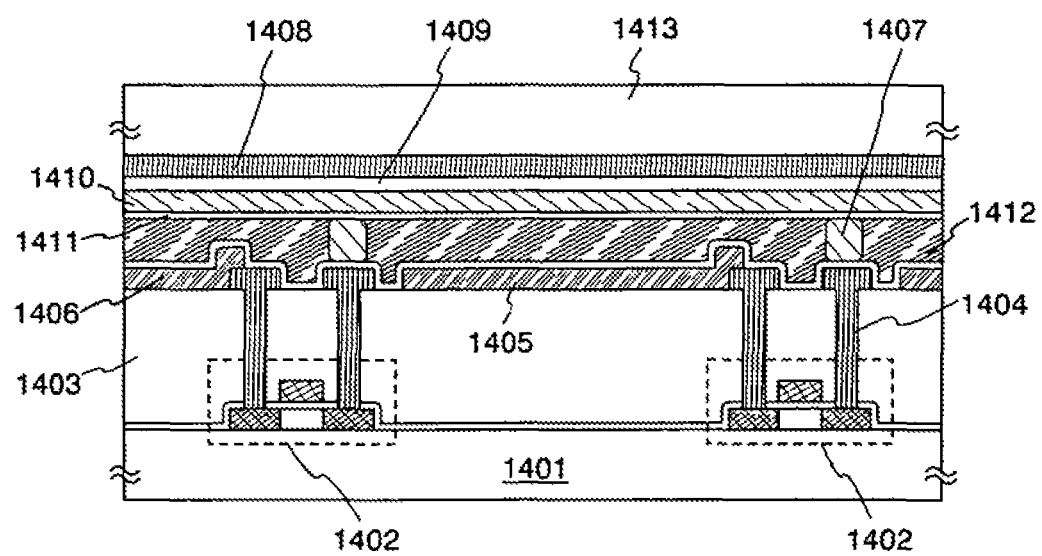
FIG. 14 is a diagram for explaining a configuration of a liquid crystal element formed in a pixel portion.
Figure 15A:
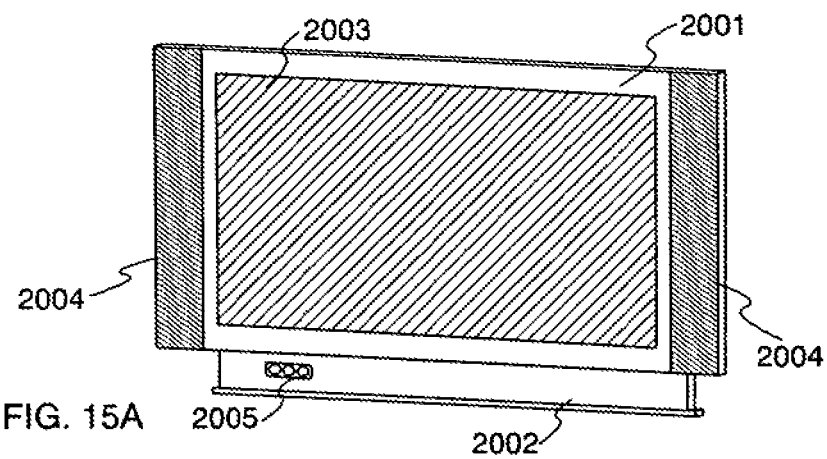
FIGS. 15A through 15G are diagrams for explaining electronic devices formed by use of the invention.
Figure 15B:
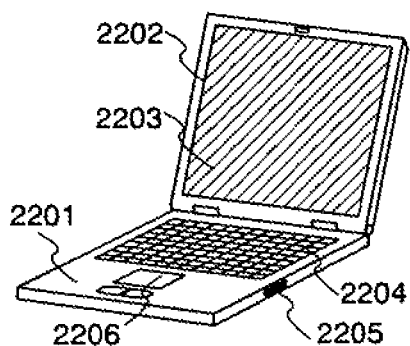
Figure 15C:
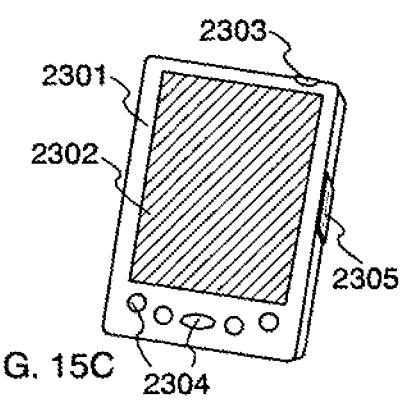
Figure 15D:
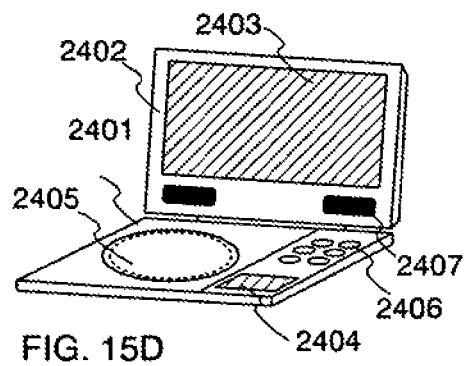
Figure 15E:
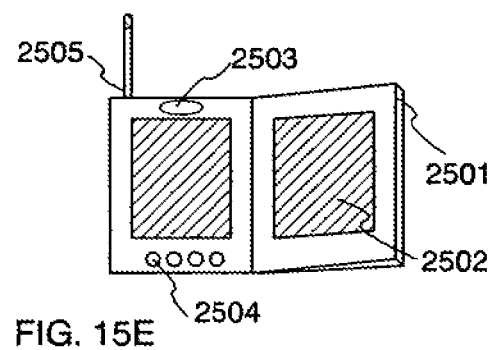
Figure 15F:
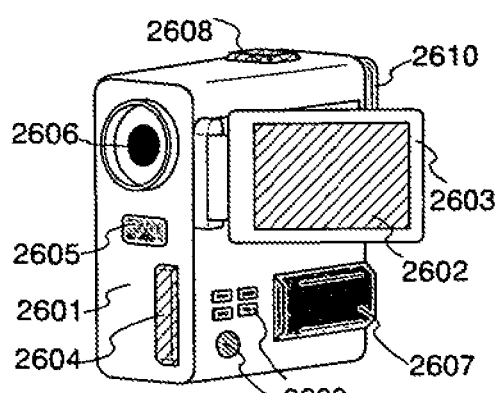
Figure 15G:
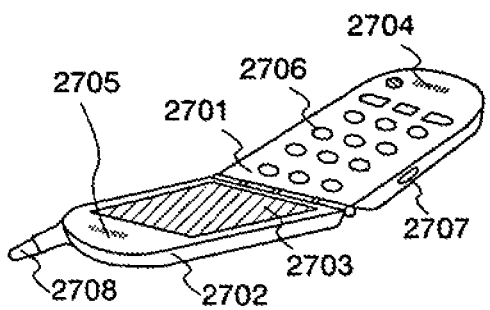

As shown in FIG. 14, on a substrate 1401, a TFT 1402 is formed and electrically connected through a wiring 1404 formed in an opening of an interlayer insulating film 1403 to a first electrode 1405 that is a pixel electrode. Furthermore, on the first electrode 1405, an oriented film 1406 is formed followed by rubbing. Still furthermore, in order to keep a substrate distance, a columnar spacer 1407 made of an organic resin is disposed. An order of formation of the spacer 1407 and the oriented film 1406 may be reversed.

On the other hand, an opposite substrate 1413, on the substrate, includes a colored layer 1408, a flattening film 1409, an opposite electrode 1410 made of a transparent conductive film and an oriented film 1411. As the colored layer 1408, a red-colored layer, a blue-colored layer and a green-colored layer may be respectively formed.

The substrate 1401 thereon an element is formed and the opposite substrate 1413 are adhered with a sealant (not shown in the drawing). The sealant includes filler. With a uniform separation (preferably 2.0 to 3.0 µm) maintained by the filler and the spacer, two substrates are adhered. Furthermore, between both substrates, a liquid crystal 1412 is filled and completely sealed with a sealant. As the liquid crystal 1412, known liquid crystal materials can be used.

When a structure shown in FIG. 14 is taken, light is inputted from a side of the opposite substrate 1413, modulated by the liquid crystal 1412 and exits from a side of the substrate 1401 thereon the element is formed.

In the invention, the first electrode can be formed also with a reflective metal film (specifically, aluminum (alloy) film and so on). In this case, light enters from a side of the opposite substrate 1413, followed by modulating by the liquid crystal 1412, is reflected by the first electrode 1405, and is exited again from a side of the opposite substrate 1413. When thus structured, since light does not penetrate below the first electrode 1405, a memory element, a resistance element and the like can be disposed.

[Embodiment 7]

When the present invention is applied, a module including an integrated circuit having a lamination structure on a panel can be completed. Accordingly, by incorporating these modules, various kinds of electronic devices can be completed.

As these electronic devices, devices provided with a semiconductor device that can reproduce a recording medium and can display its image such as a video camera, a digital camera, a head-mount display (a goggle type display), a car navigation, a projector, a car stereo, a personal computer and a portable information terminal (a mobile computer, a portable telephone, a portable game machine, an electronic book or the like) can be cited. Specific embodiments of these electronic devices are shown in FIG. 14.

FIG. 14A shows a display device and the display device includes a casing 2001, a support base 2002, a display portion 2003, a speaker portion 2004, a video input terminal 2005 and so on. A module of the display portion 2003 has an integrated circuit formed by use of the transcription technique. The display device includes all information display devices for use in personal computers, TV broadcasting, billboard display and so on.

FIG. 14B shows a note type personal computer and the personal computer includes a body 2201, a casing 2202, a display portion 2203, a keyboard 2204, an external connection port 2205, a pointing mouse 2206 and so on. A module of the display portion 2203 has an integrated circuit formed by use of transcription technique.

FIG. 14C shows a mobile computer and the mobile computer includes a body 2301, a display portion 2302, a switch 2303, an operation key 2304, an infrared port 2305 and so on. A module of the display portion 2302 has an integrated circuit formed by use of transcription technique.

FIG. 14D shows a player that uses a recording medium in which a program was recorded (hereinafter, referred to as recording medium), and the player includes a body 2401, a casing 2402, a display portion A2403, a display portion B2404, a recording medium read portion 2405, an operation key 2406, a speaker 2407 and so on. The player uses, as the recording medium, a DVD (Digital Versatile Disc), a CD and so on and can serve for appreciation of music, movie viewing, game and INTERNET.

FIG. 14E shows a portable book (electronic book) and the book includes a body 2501, a display portion 2502, a recording medium 2503, an operation switch 2504, an antenna 2505 and so on. A module of the display portion 2502 has an integrated circuit formed by use of a transcription technique.

FIG. 14F shows a video camera and the video camera includes a body 2601, a display portion 2602, a casing 2603, an external connection port 2604, a remote control receiver 2605, a receiver 2606, a battery 2607, an audio input portion 2608, an operation key 2609, an eyepiece portion 2610 and so on. A module of the display portion 2602 has an integrated circuit formed by use of a transcription technique.

FIG. 14G shows a portable telephone and the potable telephone includes a body 2701, a casing 2702, a display portion 2703, an audio input portion 2704, an audio output portion 2705, an operation key 2706, an external connection port 2707, an antenna 2708 and so on. A module of the display portion 2703 has an integrated circuit formed by use of transcription technique.

As mentioned above, a module having an integrated circuit manufactured according to the invention is very wide in the application range and can be applied to every field of products.

DESCRIPTION OF REFERENCE NUMERALS AND SIGNS

- 101: substrate
- 102: pixel portion
- 103: source side driving circuit
- 104, 105: gate side driving circuit
- 106: integrated circuit
- 107: FPC
- 201: substrate
- 202: pixel portion
- 203: driving circuit
- 204: laminated circuit
- 205: FPC
- 211: first substrate
- 212: first element formation layer
- 213: second substrate
- 214: second element formation layer
- 215: third substrate
- 216: third element formation layer
- 301: substrate
- 302: pixel portion
- 303: source side driving circuit
- 304: gate side driving circuit
- 305: gate side driving circuit
- 306: display controller
- 307: frame memory A
- 308: frame memory B
- 309: power source circuit
- 310: FPC
- 311: power source of source driving circuit
- 312: power source of gate driving circuit
- 313: power source of display controller
- 314: power source of frame memory
- 315: element driving power source
- 316: source side driving circuit clock signal •start pulse •video signal
- 317: gate side driving circuit clock signal •start pulse
- 318: frame memory read/write control signal
- 321: signal control circuit
- 322: CPU
- 323: memory controller
- 324: memory
- 401: divider
- 402: horizontal clock generator
- 403: vertical clock generator
- 404: video signal processor
- 422: memory R/W control circuit
- 423: X counter
- 424: Y counter
- 425: X counter
- 426: Y counter
- 427: X decoder
- 428: Y decoder
- 429: X decoder
- 430: Y decoder
- 441: source side driving circuit
- 442: gate side driving circuit
- 443: frame memory A
- 444: frame memory B
- 500: first substrate
- 501: metal layer
- 502: metal oxide layer
- 503: oxide layer
- 504: element formation layer
- 505: underlying layer
- 506: impurity region
- 507: channel formation region
- 508: gate insulating film
- 509: gate electrode
- 510: wiring
- 511: organic resin layer
- 512: first adhesive layer
- 513: second substrate
- 514: second adhesive layer
- 515: third substrate
- 516: opening
- 517: auxiliary wiring
- 518: third adhesive layer (anisotropically conductive adhesive layer)
- 519: fourth substrate
- 520: thermally conductive film
- 521: fourth adhesive layer (anisotropically conductive adhesive layer)
- 522: organic resin layer
- 523: fifth adhesive layer
- 524: fifth substrate
- 525: auxiliary wiring
- 601: dotted line
- 701: second element formation layer
- 702: first element formation layer
- 800: first substrate
- 801: metal layer
- 802: metal oxide layer
- 803: oxide layer
- 805: wiring
- 814: second adhesive layer
- 815: second substrate
- 821: first adhesive layer (anisotropically conductive adhesive layer)
- 822: organic resin layer
- 823: third adhesive layer
- 824: third substrate
- 825: auxiliary wiring
- 826: bump
- 827: fourth substrate (driving circuit)
- 828: fourth adhesive layer (anisotropically conductive adhesive layer)
- 901: second element formation layer
- 902: first element formation layer
- 1101: cassette station
- 1102a: transfer chamber A
- 1102b: transfer chamber B
- 1102c: transfer chamber C
- 1103a: transfer means B
- 1103b: transfer means B
- 1103c: transfer means C
- 1104a: delivery chamber A
- 1104b: delivery chamber B 1105: coating chamber (1)
1106: UV irradiation chamber (1)
1107: scribing chamber
1108: adhesive formation chamber (1)
1109: adhesive supply chamber (1)
1110: substrate pasting chamber (1)
1111: substrate supply chamber (1)
1112: adhesive formation chamber (2)
1113: adhesive supply chamber (2)
1114: substrate pasting chamber (2)
1115: substrate supply chamber (2)
1116: peeling chamber (1)
1117: substrate recovery chamber (1)
1118: pattern formation chamber
1119: etching chamber
1120: sputtering chamber
1121: coating chamber (2)
1122: substrate pasting chamber (3)
1123: substrate supply chamber (3)
1124: UV irradiation chamber (2)
1126: substrate recovery chamber (2)
1125: peeling chamber (2)
1127: adhesive removing chamber
1128: cleaning chamber
1201: substrate
1202: channel formation region
1203: source region
1204: drain region
1205: gate insulating film
1206: gate electrode
1207: wiring
1208: interlayer insulating film
1212: insulating film
1213: electroluminescent layer
1214: second electrode
1215: light-emitting element
1221: switching TFT
1222: current control TFT
1231: first electrode (translucent)
1232: electroluminescent layer
1233: second electrode (light blocking)
1241: first electrode (translucent)
1242: electroluminescent layer
1243: second electrode (translucent)
1301: first electrode (translucent)
1302: electroluminescent layer
1303: second electrode (translucent)
1304: doped layer
1305: hole injection layer
1306: hole transporting layer
1307: light-emitting layer
1308: blocking layer
1309: electron transporting layer
1401: substrate
1402: TFT
1403: interlayer insulating film
1404: wiring
1405: first electrode
1406: oriented film
1407: spacer
1408: colored layer
1409: flattening layer
1410: opposite electrode
1411: oriented film
1412: liquid crystal layer
1413: opposite substrate
2001: casing
2002: supporting table
2003: display portion
2004: speaker portion
2005: video input terminal
2201: body
2202: casing
2203: display portion
2204: keyboard
2205: external connection port
2206: pointing mouth
2301: body
2302: display portion
2303: switch
2304: operation key
2305: infrared port
2401: body
2402: casing
2403: display portion A
2404: display portion B
2405: recording medium read portion
2406: operation key
2407: speaker portion
2501: body
2502: display portion
2503: recording medium
2504: operation switch
2505: antenna
2601: body
2602: display portion
2603: casing
2604: external connection port
2605: remote control receiver
2606: receiver
2607: battery
2608: audio input portion
2609: operation key
2610: eyepiece portion
2701: body
2702: casing
2703: display portion
2704: audio input portion
2705: audio output portion
2706: operation key
2707: external connection port
2708: antenna

What is claimed is:

1. A semiconductor device comprising:
a first substrate;
a pixel portion over the first substrate, wherein the pixel portion comprises a light emitting element;
a second substrate over the pixel portion;
a source driving circuit over the first substrate, wherein the source driving circuit comprises a first transistor; and
a layered circuit over the source driving circuit, the layered circuit comprising:
a first integrated circuit comprising a second transistor; and
a second integrated circuit comprising a third transistor, over the first integrated circuit,
wherein the source driving circuit and the layered circuit are electrically connected via a bump,
wherein the second substrate and the source driving circuit do not overlap each other, and
wherein the first transistor and the second transistor overlap each other with the bump provided therebetween.

2. The semiconductor device according to claim 1, wherein each of the first transistor, the second transistor, and the third transistor comprises amorphous semiconductor.

3. The semiconductor device according to claim 1, wherein the first substrate is selected from a glass substrate, a quartz substrate, a plastic substrate, a ceramics substrate, a silicon substrate, a metal substrate and a stainless steel substrate.

4. The semiconductor device according to claim 1, further comprising a flexible printed circuit over the first substrate.

5. The semiconductor device according to claim 1, wherein the bump comprises a material selected from tungsten, tungsten-rhenium, palladium, and beryllium copper.

6. The semiconductor device according to claim 1, wherein each of the first integrated circuit and the second integrated circuit comprises at least one of a display controller, a frame memory a power source circuit, a CPU and a memory.

7. The semiconductor device according to claim 1, further comprising one or more circuits in the layered circuit.

8. A electronic device comprising the semiconductor device according to claim 1, wherein the electronic device is any one of a group comprising a display device, a notebook type personal computer, a mobile computer, a player with a recording medium, an electronic book, a video camera, a portable telephone, a digital camera, a head-mount display, a car navigation system, a projector and a car stereo.

9. A semiconductor device comprising:
a first substrate;
a pixel portion over the first substrate, wherein the pixel portion comprises a light emitting element and a pixel transistor;
a second substrate over the pixel portion;
a source driving circuit over the first substrate, wherein the source driving circuit comprises a first transistor; and
a layered circuit over the source driving circuit, the layered circuit comprising:
a first integrated circuit comprising a second transistor; and
a second integrated circuit comprising a third transistor, over the first integrated circuit,
wherein the source driving circuit and the layered circuit are electrically connected via a bump,
wherein the second substrate and the source driving circuit do not overlap each other,
wherein the first transistor and the second transistor overlap each other with the bump provided therebetween, and
wherein the pixel transistor and the first transistor are provided over a same surface.

10. The semiconductor device according to claim 9, wherein each of the pixel transistor, the first transistor, the second transistor, and the third transistor comprises amorphous semiconductor.

11. The semiconductor device according to claim 9, wherein the first substrate is selected from a glass substrate, a quartz substrate, a plastic substrate, a ceramics substrate, a silicon substrate, a metal substrate and a stainless steel substrate.

12. The semiconductor device according to claim 9, further comprising a flexible printed circuit over the first substrate.

13. The semiconductor device according to claim 9, wherein the bump comprises a material selected from tungsten, tungsten-rhenium, palladium, and beryllium copper.

14. The semiconductor device according to claim 9, wherein each of the first integrated circuit and the second integrated circuit comprises at least one of a display controller, a frame memory a power source circuit, a CPU and a memory.

15. The semiconductor device according to claim 9, further comprising one or more circuits in the layered circuit.

16. A electronic device comprising the semiconductor device according to claim 9, wherein the electronic device is any one of a group comprising a display device, a notebook type personal computer, a mobile computer, a player with a recording medium, an electronic book, a video camera, a portable telephone, a digital camera, a head-mount display, a car navigation system, a projector and a car stereo.

17. The semiconductor device according to claim 1, wherein the first transistor and the third transistor overlap each other with the second transistor provided therebetween.

18. The semiconductor device according to claim 1, further comprising a flexible printed circuit over the first substrate,
wherein the flexible printed circuit and the layered circuit do not overlap each other.

19. The semiconductor device according to claim 9, wherein the first transistor and the third transistor overlap each other with the second transistor provided therebetween.

20. The semiconductor device according to claim 9, further comprising a flexible printed circuit over the first substrate,
wherein the flexible printed circuit and the layered circuit do not overlap each other.

* * * * *